(12) United States Patent
Mayuzumi

(10) Patent No.: US 8,896,068 B2
(45) Date of Patent: Nov. 25, 2014

(54) SEMICONDUCTOR DEVICE INCLUDING SOURCE/DRAIN REGIONS AND A GATE ELECTRODE, AND HAVING CONTACT PORTIONS

(75) Inventor: Satoru Mayuzumi, Tokyo (JP)

(73) Assignee: Sony Corporation, Tokyo (JP)

( * ) Notice: Subject to any disclaimer, the term of this patent is extended or adjusted under 35 U.S.C. 154(b) by 493 days.

(21) Appl. No.: 12/854,613

(22) Filed: Aug. 11, 2010

(65) Prior Publication Data

US 2011/0042752 A1 Feb. 24, 2011

(30) Foreign Application Priority Data

Aug. 20, 2009 (JP) ................ P2009-190645

(51) Int. Cl.
| | | |
|---|---|---|
| H01L 27/092 | (2006.01) | |
| H01L 21/768 | (2006.01) | |
| H01L 21/285 | (2006.01) | |
| H01L 29/78 | (2006.01) | |
| H01L 23/485 | (2006.01) | |
| H01L 21/8238 | (2006.01) | |
| H01L 29/66 | (2006.01) | |

(52) U.S. Cl.
CPC .. *H01L 21/823871* (2013.01); *H01L 21/76816* (2013.01); *H01L 21/76877* (2013.01); *H01L 21/28518* (2013.01); *H01L 29/7845* (2013.01); *H01L 27/092* (2013.01); *H01L 23/485* (2013.01); *H01L 29/66545* (2013.01); *H01L 29/7834* (2013.01); *H01L 21/76897* (2013.01); *H01L 21/2855* (2013.01); *H01L 29/66636* (2013.01)
USPC ..................................................... 257/369

(58) Field of Classification Search
CPC . H01L 21/8239; H01L 21/336; H01L 27/092; H01L 29/78

USPC ......... 257/288, 369, 390, 397, 398, 401, 410, 257/E23.178, E21.409, E21.632, E29.255, 257/E27.062

See application file for complete search history.

(56) References Cited

U.S. PATENT DOCUMENTS

| | | | | |
|---|---|---|---|---|
| 6,498,062 | B2* | 12/2002 | Durcan et al. | 438/246 |
| 2004/0232497 | A1* | 11/2004 | Akiyama et al. | 257/390 |

(Continued)

FOREIGN PATENT DOCUMENTS

| | | |
|---|---|---|
| JP | 2000-223699 | 8/2000 |
| JP | 2001-267421 | 9/2001 |

(Continued)

OTHER PUBLICATIONS

C. Auth et al.; 45nm High-k + Metal Gate Strain-Enhanced Transistors; IEEE; Symposium on VLSI Technology Digest of Technical Papers; 2008.

(Continued)

*Primary Examiner* — Marcos D. Pizarro
*Assistant Examiner* — Sue Tang
(74) *Attorney, Agent, or Firm* — Dentons US LLP

(57) ABSTRACT

A method for manufacturing a semiconductor device includes the steps of: (a) forming a gate electrode on a substrate, forming source/drain regions and a channel forming region in the substrate, and forming on the source/drain regions a first interlayer insulating layer equal in height to the gate electrode; (b) forming in the first interlayer insulating layer groove-shaped first contact portions connected to the source/drain regions; (c) forming a second interlayer insulating layer on a whole surface; (d) forming hole-shaped second contact portions in portions of the second interlayer insulating layer on the first contact portion; and (e) forming on the second interlayer insulating layer wires connected to the second contact portions.

13 Claims, 26 Drawing Sheets

(56) References Cited

U.S. PATENT DOCUMENTS

2004/0251479 A1* 12/2004 Tsutsui et al. ............... 257/249
2008/0191289 A1* 8/2008 Pas et al. ...................... 257/401

FOREIGN PATENT DOCUMENTS

| | | |
|---|---|---|
| JP | 2001-291770 | 10/2001 |
| JP | 2002-190592 | 7/2002 |
| JP | 2003-077936 | 3/2003 |
| JP | 2007-110098 | 4/2007 |
| JP | 2008-218727 | 9/2008 |
| JP | 2008-288329 | 11/2008 |
| JP | 2009-164391 | 7/2009 |

OTHER PUBLICATIONS

Japanese Office Action issued in connection with related Japanese Patent Application No. 2009-190645 dated Aug. 27, 2013.

* cited by examiner

[EXAMPLE 1]

[STEP-100A]

[STEP-100B]

[STEP-100C]

[STEP-100C] (CONTINUED)

[STEP-100D]

[STEP-100D] (CONTINUED)

[STEP-100D] (CONTINUED)

[STEP-100D] (CONTINUED)

[STEP-100E]

[STEP-100F]

[STEP-100G]

[STEP-100H]

[STEP-100I]

[STEP-100I] (CONTINUED)

[STEP-130]

[STEP-130] (CONTINUED)

(EXAMPLE 2)

[STEP-200A]

[STEP-200B]

[STEP-200C]

[STEP-200C](CONTINUED)

[STEP-200D]

[STEP-200D](CONTINUED)

[STEP-200D](CONTINUED)

[STEP-200D](CONTINUED)

[STEP-200E]

[STEP-200F]

[STEP-210]

[STEP-210](CONTINUED)

[STEP-230]

[STEP-230](CONTINUED)

[EXAMPLE 3]

[STEP-310]

[STEP-310](CONTINUED)

[STEP-310](CONTINUED)

[STEP-310](CONTINUED)

[STEP-330]

# SEMICONDUCTOR DEVICE INCLUDING SOURCE/DRAIN REGIONS AND A GATE ELECTRODE, AND HAVING CONTACT PORTIONS

BACKGROUND OF THE INVENTION

1. Field of the Invention

The present invention relates to semiconductor devices and semiconductor device manufacturing methods.

2. Description of Related Art

The recent movement toward miniaturization of elements in semiconductor devices and semiconductor integrated circuits has presented the problem of increasing contact resistance. At the same time, many attempts to improve the characteristics of circuit transistors have been made with the use of a technique that intends to increase carrier mobility by applying stress to a channel forming region with a stress applying material.

Concerning the problem of increasing contact resistance, for example, 45 nm High-k+Metal Gate Strain-Enhanced Transistors, C. Auth et al., VLSI Sym. Tech. Dig., pp. 128, (2008) (Non-Patent Document 1) discloses a groove-shaped (trench) contact portion. This publication intends to improve carrier mobility with a contact portion made of a metallic material that has an internal stress.

JP-A-2001-291770 (Patent Document 1) discloses a technique to reduce contact resistance, in which insulating walls are formed on the underlying interlayer insulating layer so as to surround source/drain regions, and a contact plug is formed on a first side-wall spacer provided on the side faces of the insulating walls and a control electrode. Metal plugs connect the contact plug to the wires provided on the overlying interlayer insulating layer formed on the whole surface.

SUMMARY OF THE INVENTION

FIG. 26A is a schematic partial cross sectional view of the semiconductor device of Non-Patent Document 1. FIG. 26B is a schematic diagram illustrating an interlayer insulating layer as viewed from above. As illustrated in the figures, groove-shaped first contact portions in contact with source/drain regions are formed in the interlayer insulating layer formed on the whole surface, and a groove-shaped second contact portion is formed in contact with the top face of the gate electrode. In FIG. 26B, the contact portions and the interlayer insulating layer are indicated by different hatched lines for clarity. The groove-shaped first contact portions and second contact portion are exposed on the top face of the interlayer insulating layer. Accordingly, a wire layout is required that avoids the groove-shaped contact portions on the interlayer insulating layer. This makes it difficult to design the wires freely, and the wires need to extend a long distance, increasing the wire resistance or capacitance, and the area of the circuit block. When the groove-shaped second contact portion and first contact portions are to be simultaneously formed on the gate electrode and the source/drain regions, the interlayer insulating layer is etched by different thicknesses. Because over etching time is longer for the gate electrode than for the source/drain regions, there is a possibility that the gate electrode will be damaged by etching.

In the technique disclosed in JP-A-2001-291770, because the contact plug and the control electrode are separated by only the first side-wall spacer, shorting is likely to occur between the contact plug and the control electrode. Further, because the contact plug is formed in the form of a side wall, position misregistration is likely to occur between the contact plug and the metal plug connected thereto. Further, when the width of an element isolation region is made narrower by circuit miniaturization, shorting between the metal plugs becomes likely as the distance between the metal plug and that connected to the contact plug provided adjacent to the element isolation region becomes reduced. For these reasons, the technique disclosed in JP-A-2001-291770 is not suited for miniaturization process, and a reduction in circuit area is difficult to achieve with this technique.

Accordingly, there is a need for a semiconductor device and a semiconductor device manufacturing method suited for miniaturization process, and that allow for more freedom in wire design, and are unlikely to pose problems in forming the contact portion connected to the gate electrode, and the contact portions connected to the source/drain regions.

A semiconductor device according to First Embodiment of the present invention includes:

(A) source/drain regions and a channel forming region formed in a substrate;

(B) a gate electrode formed above the channel forming region via a gate insulating film;

(C) a first interlayer insulating layer formed on the source/drain regions;

(D) first contact portions formed in the first interlayer insulating layer and connected to the source/drain regions;

(E) a second interlayer insulating layer formed on the gate electrode, the first interlayer insulating layer, and the first contact portions;

(F) second contact portions formed in portions of the second interlayer insulating layer on the first contact portions; and (G) wires formed on the second interlayer insulating layer and connected to the second contact portions.

The top faces of the gate electrode, the first contact portions, and the first interlayer insulating layer lie within the same plane.

The first contact portions have a groove shape.

The second contact portions have a hole shape.

A semiconductor device according to Second Embodiment of the present invention is a CMOS-type semiconductor device of a dual gate structure, and includes an n-channel semiconductor device and a p-channel semiconductor device each of which includes:

(A) source/drain regions and a channel forming region formed in a substrate;

(B) a gate electrode formed above the channel forming region via a gate insulating film;

(C) a first interlayer insulating layer formed on the source/drain regions;

(D) first contact portions formed in the first interlayer insulating layer and connected to the source/drain regions;

(E) a second interlayer insulating layer formed on the gate electrode, the first interlayer insulating layer, and the first contact portions;

(F) second contact portions formed in portions of the second interlayer insulating layer on the first contact portions; and (G) wires formed on the second interlayer insulating layer and connected to the second contact portions.

The top faces of the gate electrode, the first contact portions, and the first interlayer insulating layer lie within the same plane.

The first contact portions of the n-channel semiconductor device and the first contact portions of the p-channel semiconductor device have a groove shape and are joined to each other.

The second contact portions of the n-channel semiconductor device and the second contact portions of the p-channel semiconductor device have a hole shape.

The first contact portions of the n-channel semiconductor device have a tensile stress.

The first contact portions of the p-channel semiconductor device have a compression stress.

A semiconductor device manufacturing method according to First Embodiment of the present invention includes the steps of:

(a) forming a gate electrode on a substrate, forming source/drain regions and a channel forming region in the substrate, and forming on the source/drain regions a first interlayer insulating layer whose top face lies within the same plane as a top face of the gate electrode;

(b) forming in the first interlayer insulating layer groove-shaped first contact portions connected to the source/drain regions;

(c) forming a second interlayer insulating layer on a whole surface;

(d) forming hole-shaped second contact portions in portions of the second interlayer insulating layer on the first contact portion; and (e) forming on the second interlayer insulating layer wires connected to the second contact portions.

A semiconductor device manufacturing method according to Second Embodiment of the present invention is a method for manufacturing a CMOS-type semiconductor device of a dual gate structure, and includes the steps of:

(a) forming a gate electrode on a substrate for an n-channel semiconductor device and a p-channel semiconductor device, forming source/drain regions and a channel forming region in the substrate for each of the n-channel semiconductor device and the p-channel semiconductor device, and forming on the source/drain regions of the n-channel semiconductor device and the p-channel semiconductor device a first interlayer insulating layer whose top face lies within the same plane as a top face of the gate electrodes;

(b) forming in the first interlayer insulating layer groove-shaped first contact portions that extend from portions of the first interlayer insulating layer on the source/drain regions of the n-channel semiconductor device to portions of the first interlayer insulating layer on the source/drain regions of the p-channel semiconductor device;

(c) forming a second interlayer insulating layer on a whole surface;

(d) forming hole-shaped second contact portions in portions of the second interlayer insulating layer on the first contact portions; and (e) forming on the second interlayer insulating layer wires connected to the second contact portions.

The first contact portions of the n-channel semiconductor device have a tensile stress.

The first contact portions of the p-channel semiconductor device have a compression stress.

In the semiconductor devices and the semiconductor device manufacturing methods according to First Embodiment and Second Embodiment of the present invention, groove-shaped first contact portions connected to the source/drain regions are provided. In this way, the contact resistance between the source/drain regions and the first contact portions can be reduced. Hole-shaped second contact portions connected to the first contact portions are also provided. Because the hole-shaped second contact portions are exposed on the top face of the second interlayer insulating layer, the wires formed on the second interlayer insulating layer can be designed freely, and do not need to extend a long distance.

Further, because the top faces of the gate electrode, the first contact portions, and the first interlayer insulating layer lie within the same plane, the second interlayer insulating layer can be etched by the same thickness when forming the hole-shaped second contact portions simultaneously on the gate electrode and the source/drain regions. There accordingly will be no etching damage to the gate electrode. Further, because the hole-shaped second contact portions are provided on the groove-shaped first contact portions, position misregistration is unlikely to occur between these contact portions. Further, because shorting between the contact portions is unlikely to occur in circuit miniaturization, the device and method are suited for miniaturization process, and the circuit area can be reduced. As described above, the embodiments of the present invention provide a semiconductor device and a semiconductor device manufacturing method suited for miniaturization process, and that pose less restriction on wire design, and are unlikely to pose problems in forming the contact portion connected to the gate electrode, and the contact portions connected to the source/drain regions. Further, because the first contact portions of the n-channel semiconductor device have a tensile stress, and the first contact portions of the p-channel semiconductor device a compression stress, mobility can be improved in each type of semiconductor device.

DESCRIPTION OF THE PREFERRED EMBODIMENTS

Figure 1A:
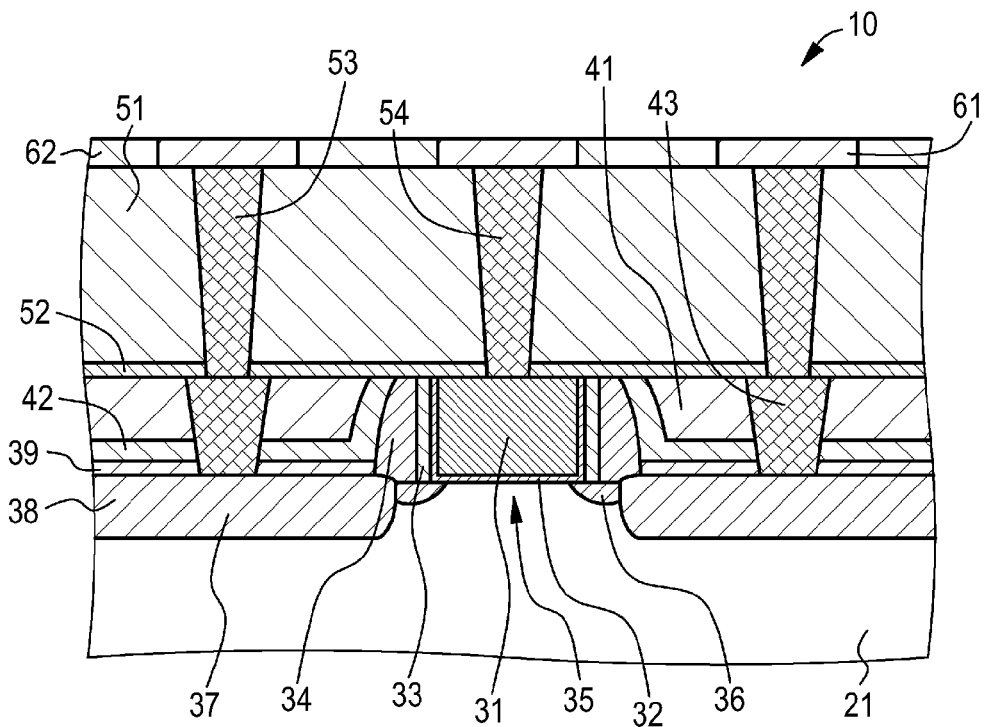
FIG. 1A is a schematic partial end view of a semiconductor device of Example 1 along the gate length, taken at A-A indicated by arrows in FIG. 1B.

The following will describe the present invention based on examples with reference to the accompanying drawings. It should be noted that the invention is not limited to the following examples, and the numerical values and materials presented in the following examples are illustrative. Descriptions will be given in the following order.

1. Overall description of semiconductor device and semiconductor device manufacturing method of the present invention
2. Example 1 (semiconductor device and semiconductor device manufacturing method according to First Embodiment of the present invention)
3. Example 2 (variation of Example 1)
4. Example 3 (semiconductor device and semiconductor device manufacturing method according to Second Embodiment of the present invention)
5. Example 4 (a variation of Example 3, and others)

[Overall Description of Semiconductor Device and Semiconductor Device Manufacturing Method of the Present Invention]

A semiconductor device or a semiconductor device manufacturing method according to First Embodiment of the present invention may be adapted to be an n-channel semiconductor device, or to provide an n-channel semiconductor device, in which first contact portions have a tensile stress. Alternatively, a semiconductor device or a semiconductor device manufacturing method according to First Embodiment of the present invention may be adapted to be a p-channel semiconductor device, or to provide a p-channel semiconductor device, in which first contact portions have a compression stress.

In the semiconductor device according to First Embodiment of the present invention of the foregoing preferable configuration, a stress applying film may be formed in source/drain regions. In the semiconductor device manufacturing method according to First Embodiment of the present invention of the foregoing preferable configuration, a stress applying film may be formed in source/drain regions in step (a). Further, a semiconductor device manufacturing method according to Second Embodiment of the present invention may be adapted so that a stress applying film is formed in the source/drain regions of each of an n-channel semiconductor device and a p-channel semiconductor device in step (a).

Further, the semiconductor device according to First Embodiment of the present invention of the foregoing preferable configuration may be adapted to include an etching stop layer between a gate electrode, a first interlayer insulating layer and the first contact portions, and a second interlayer insulating layer. Further, the semiconductor device manufacturing method according to First Embodiment of the present invention of the foregoing preferable configuration may be adapted to form an etching stop layer between a gate electrode, a first interlayer insulating layer and the first contact portions, and a second interlayer insulating layer (i.e., on the whole surface) after step (b) and before step (c), and to form a second interlayer insulating layer on the etching stop layer in step (c). Further, in the semiconductor device manufacturing method according to Second Embodiment of the present invention of the foregoing preferable configuration may be adapted to form an etching stop layer on the whole surface after step (b) and before step (c), and to form a second interlayer insulating layer on the etching stop layer in step (c).

The semiconductor device according to First Embodiment of the present invention of the foregoing preferable configuration may be adapted to include a gate insulating film that extends between the first interlayer insulating layer and the gate electrode. Further, a semiconductor device according to Second Embodiment of the present invention may be adapted to include a gate insulating film that extends between a first interlayer insulating layer and a gate electrode in each of an n-channel semiconductor device and a p-channel semiconductor device. Specifically, in the semiconductor devices of the foregoing configurations, the gate electrode is formed by a so-called gate-last process.

Further, the semiconductor device manufacturing method according to First Embodiment of the present invention of the foregoing preferable configuration may be adapted so that, in step (a), the first interlayer insulating layer whose top face lies on the same plane as the top face of the gate electrode is formed on the source/drain regions after forming the source/drain regions and a channel forming region in a substrate and before forming the gate electrode on the substrate. Further, the semiconductor device manufacturing method according to Second Embodiment of the present invention of the foregoing preferable configuration may be adapted so that, in step (a), the first interlayer insulating layer whose top face lies within the same plane as the top face of the gate electrode is formed on the source/drain regions of each of the n-channel semiconductor device and the p-channel semiconductor device after forming the source/drain regions and a channel forming region in a substrate for each of the n-channel semiconductor device and the p-channel semiconductor device and before forming the gate electrode on the substrate for each of the n-channel semiconductor device and the p-channel semiconductor device. For convenience, these methods in regard to step (a) will be collectively referred to as a "gate electrode forming method of First Embodiment." The gate electrode forming method of First Embodiment is a gate-last process.

Further, the semiconductor device manufacturing method according to First Embodiment of the present invention of the foregoing preferable configuration may be adapted so that, in step (a), the source/drain regions and the channel forming region are formed in the substrate after forming the gate electrode on the substrate and before forming the first interlayer insulating layer whose top face lies on the same plane as the top face of the gate electrode on the source/drain regions. Further, the semiconductor device manufacturing method according to Second Embodiment of the present invention of the foregoing preferable configuration may be adapted so that, in step (a), the source/drain regions and the channel forming region are formed in the substrate for each of the n-channel semiconductor device and the p-channel semiconductor device after forming the gate electrode on the substrate for each of the n-channel semiconductor device and the p-channel semiconductor device and before forming the first interlayer insulating layer whose top face lies on the same plane as the top face of the gate electrode on the source/drain regions for each of the n-channel semiconductor device and the p-channel semiconductor device. For convenience, these methods in regard to step (a) will be collectively referred to as a "gate electrode forming method of Second Embodiment."

As used herein, the "channel forming region" means not only a region where a channel is actually formed, but a region where a channel can be formed. For example, a portion of the substrate opposite the gate electrode can be a channel forming region. Further, the "gate electrode" encompasses not only a portion of the electrode opposite the channel forming region, but a portion (extraction electrode) that extends from such an electrode portion.

Examples of the substrate include semiconductor substrates (for example, a silicon semiconductor substrate), and bases having a semiconductor layer on its surface (for example, a glass substrate, a quartz substrate, a silicon substrate having an insulating layer on its surface, a plastic substrate, and a plastic film). The semiconductor device is formed, for example, in the well region of a semiconductor substrate or a semiconductor layer. An element isolation region of, for example, a trench structure may be formed between the semiconductor devices. The element isolation region may be of an LOCOS structure, or a combination of a trench structure and an LOCOS structure. Further, a substrate of an SOI structure obtained by the SIMOX method or a substrate bonding method may be used.

The material of the gate insulating film may be $SiO_x$ material such as silicon oxide ($SiO_2$), SiOF material, SiN material, and SiON material, or high dielectric constant materials with a dielectric constant k ($=\in/\in_0$) of about 4.0 or more. Examples of high dielectric constant material include hafnium oxide ($HfO_2$), zirconium oxide ($ZrO_2$), aluminum oxide ($Al_2O_3$), aluminum oxide-hafnium ($HfAlO_2$), silicon oxide-hafnium (HfSiO), tantalum oxide ($Ta_2O_5$), yttrium oxide ($Y_2O_3$), and lanthanum oxide ($La_2O$). The gate insulating film may be formed using one kind of material or different kinds of material. Further, the gate insulating film may be a single film (including a composite film of different materials) or a laminated film. The gate insulating films of the n-channel semiconductor device and the p-channel semiconductor device may be made of the same material or different materials. The gate insulating film can be formed using known methods. For example, methods such as the ALD (Atomic Layer Deposition) method and the MOCVD (Metal Organic Chemical Vapor Deposition) method can be used as the method of forming the gate insulating film of high dielectric constant material.

Examples of gate electrode material include polycrystalline silicon, metal, and metallic compound. Examples of metal and metallic compound include titanium, nickel, hafnium, tungsten, tantalum, cobalt, molybdenum, ruthenium, iridium, platinum (and alloys of these metals); nitrides (for example, titanium nitride) and carbides (for example, TaC) of these metals; and metal silicides (compounds of metal and semiconductor material) such as titanium silicide, nickel silicide, hafnium silicide, tantalum silicide, tantalum silicon nitride, and cobalt silicide. To adjust threshold voltage or resistance value, layers of these materials may be laminated to form the gate electrode. The gate electrode can be formed by using, for example, various PVD (Physical Vapor Deposition) methods; various CVD methods including the ALD method and the metal organic chemical vapor deposition method (MOCVD method); an electrolytic plating method; and a non-electrolytic plating method. These methods may be performed either alone or in an appropriate combination. The gate electrode also can be formed using a combination of these deposition methods with a lithography technique and an etching technique. Alternatively, the gate electrode can be formed using a known damascene process, in which a conductive material is embedded in a gate electrode-forming opening portion provided in the first interlayer insulating layer, followed by planarization using a method such as a chemical mechanical polishing method (CMP method).

It is preferable to form side walls on the both sides of the gate insulating film and the gate electrode. The side walls can be formed using materials such as silicon oxide and silicon nitride, or, for the purpose of reducing the gate capacitance, using a low-dielectric film (also known as a low-k film) used for the interlayer insulating layer. Examples of the n-type impurities contained in the source/drain regions of the n-channel semiconductor device include phosphorus (P) and arsenic (As). Examples of the p-type impurities contained in the source/drain regions of the p-channel semiconductor device include boron (B), boron fluoride ($BF_2$), and indium (In). A silicide layer may be formed over the source/drain regions, in order to reduce the contact resistance between the source/drain regions and the first contact portions. The silicide layer can be formed using, for example, titanium silicide, cobalt silicide, nickel silicide, or platinum silicide. When forming the stress applying film in the source/drain regions, it is preferable to form a silicon layer on the stress applying film before forming the silicide layer.

The first contact portions can be formed using, for example, tungsten. Tensile stress can be imparted to the first contact portions of the n-channel semiconductor device by appropriately selecting the deposition conditions (for example, power, type of process gas, and flow rate) of tungsten sputtering, and/or the deposition conditions (for example, the composition of feedstock gas, temperature, and ambient pressure) of tungsten CVD that uses $WF_6$. Compression stress can be imparted to the first contact portions of the p-channel semiconductor device by appropriately selecting the deposition conditions (for example, power, type of process gas, and flow rate) of tungsten sputtering. A Ti layer or a TiN layer that serves as an adhesive layer or a barrier metal layer may be formed as an underlayer of the tungsten layer. Examples of other materials that can impart tensile stress to the first contact portions include copper, tantalum, and tantalum nitride.

Second contact portions can be formed using, for example, tungsten, copper, tantalum, and tantalum nitride. The second contact portions may have a monolayer structure, or a laminate structure including layers of such materials. A Ti layer or a TiN layer that serves as an adhesive layer or a barrier metal layer may be formed as an underlayer.

The contact portions can be formed by first forming contact portion-forming opening portions in the interlayer insulating layer using a method such as RIE, and then embedding the foregoing material in the opening portions using a known method. For example, the contact portions can be formed by embedding tungsten in the opening portions using a sputtering method, or a CVD method such as blanket CVD, and then removing the excess tungsten layer on the interlayer insulating layer. As noted above, a Ti layer or a TiN layer may be formed in the opening portions as an adhesive layer or a barrier metal layer, before embedding tungsten in the opening portions using a sputtering method, or a CVD method such as blanket CVD.

Wires can be formed using known materials, for example, such as aluminum, copper, tungsten, tantalum, tantalum nitride, and titanium nitride. When forming the wires using, for example, tungsten (W), an adhesive layer (Ti layer or TiN layer) may be formed underneath. The wires can be formed based on a combination of a deposition technique, a lithography technique, and an etching technique, or by using a damascene process that proceeds by forming wire grooves in the second interlayer insulating layer, embedding a conductive material layer in the wire grooves, and removing the conductive material layer residing on the second interlayer insulating layer.

The first interlayer insulating layer and the second interlayer insulating layer can be formed using $SiO_x$ material, SiN material, SiON, SiOF, SiC, and low dielectric constant insulating materials with a dielectric constant k ($=\in/\in_0$) of, for example, 3.5 or less, such as organic SOG, polyimide resin, and fluoro resin (for example, fluorocarbon, amorphous-tetrafluoroethylene, polyarylether, fluorinated arylether, fluorinated polyimide, parylene, benzocyclobutene, amorphous carbon, cycloperfluorocarbon polymer, and fluorinated fullerene). The first interlayer insulating layer and the second interlayer insulating layer may be formed as laminates of these materials.

When forming the etching stop layer between the gate electrode, the first interlayer insulating layer and the first contact portions and the second interlayer insulating layer, the etching stop layer may be formed using, for example, silicon nitride (SiN). Further, when forming the stress applying film in the source/drain regions, the stress applying film may be formed using, for example, SiC (imparting tensile stress) or SiGe (imparting compression stress). The C content in the SiC film, and the Ge content in the SiGe film may be controlled according to the stress imparted to the channel forming region. A second stress applying film (stress-liner layer) may be formed so as to cover the side walls and the source/drain regions. The second stress applying film can be formed using, for example, silicon nitride (SiN). The second stress applying film formed in the n-channel semiconductor device should preferably have a tensile stress of about 1.5 GPa, and that formed in the p-channel semiconductor device should preferably have a compression stress of about 2.0 GPa. For example, a second stress applying film of SiN having a tensile stress, and a second stress applying film of SiN having a compression stress can be obtained by appropriately selecting the deposition conditions of a plasma CVD method.

EXAMPLE 1

Figure 1B:
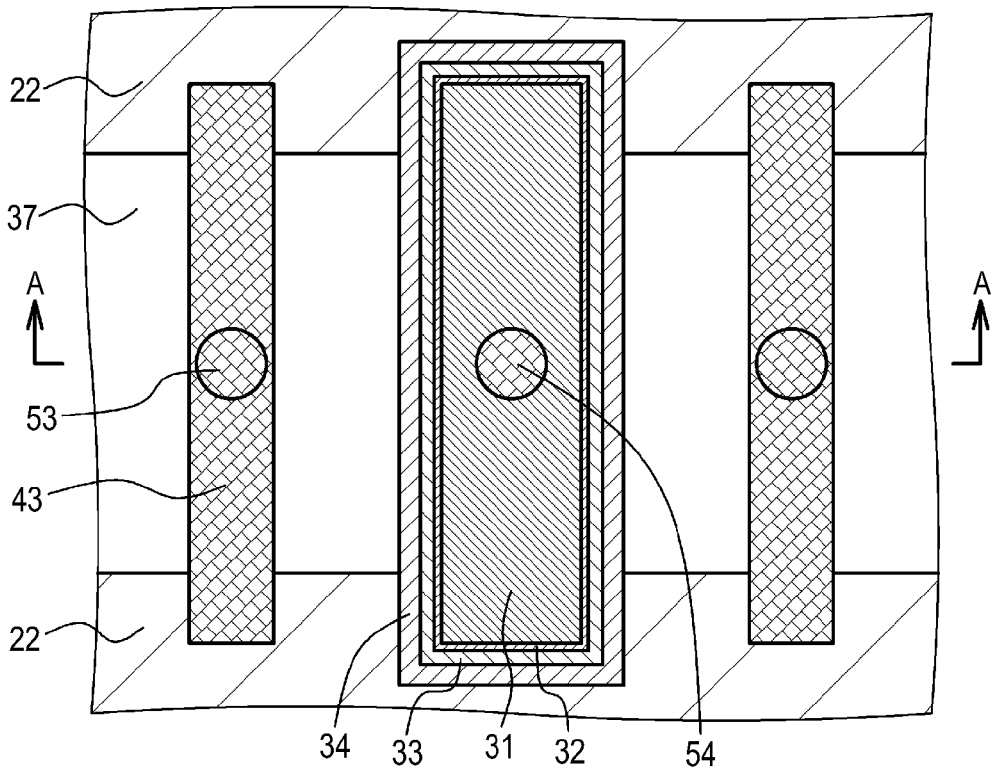
FIG. 1B is a schematic diagram illustrating the layout of each constituting element of the semiconductor device of Example 1 as viewed from above.

Example 1 concerns the semiconductor device and the semiconductor device manufacturing method according to First Embodiment of the present invention. Example 1 employs the gate electrode forming method of First Embodiment. FIG. 1A is a schematic partial end view of a semiconductor device of Example 1 along the gate length. FIG. 1B schematically illustrates the layout of each constituting element of the semiconductor device of Example 1 as viewed from above. Note that the schematic partial end view shown in FIG. 1A is taken at A-A indicated by arrows in FIG. 1B.

A semiconductor device 10 of Example 1 includes:

(A) source/drain regions 37 and a channel forming region 35 formed in a substrate (specifically, a silicon semiconductor substrate 21);

(B) a gate electrode 31 provided above the channel forming region 35 via a gate insulating film 32;

(C) a first interlayer insulating layer 41 formed on the source/drain regions 37;

(D) first contact portions 43 formed in the first interlayer insulating layer 41 and connected to the source/drain regions 37;

(E) a second interlayer insulating layer 51 formed on the gate electrode 31, the first interlayer insulating layer 41, and the first contact portions 43;

(F) second contact portions 53 formed in portions of the second interlayer insulating layer 51 on the first contact portions 43; and (G) wires 61 formed on the second interlayer insulating layer 51 and connected to the second contact portions 53.

The top faces of the gate electrode 31, the first contact portions 43, and the first interlayer insulating layer 41 are within the same plane. The first contact portions 43 have a groove shape. The second contact portions 53 have the shape of holes.

In Example 1, when the semiconductor device 10 is an n-channel semiconductor device, the first contact portions 43 have a tensile stress. On the other hand, when the semiconductor device 10 is a p-channel semiconductor device, the first contact portions 43 have a compression stress. Here, tungsten (W) is used as the material of the first contact portions 43.

In Example 1, the gate electrode 31 is made of titanium nitride (TiN), and the gate insulating film 32 is made of hafnium oxide (HfO$_2$). The gate electrode material may be different for the n-channel semiconductor device and the p-channel semiconductor device. In this case, for example, the gate electrode 31 may be made of hafnium silicide (HfSi$_x$) in the n-channel semiconductor device, and titanium nitride (TiN) in the p-channel semiconductor device. The gate insulating film 32 extends between the first interlayer insulating layer 41 and the gate electrode 31. In other words, the gate electrode 31 is formed by a gate-last process. The first interlayer insulating layer 41 and the second interlayer insulating layer 51 are made of SiO$_2$ (specifically, TEOS films). The second contact portions 53 are made of tungsten (W). The wires 61 are made of copper (Cu).

Side walls 33 and 34 are formed on the both sides of the gate insulating film 32 and the gate electrode 31. A stress applying film (for convenience, "first stress applying film 38" hereinafter) is formed in the source/drain regions 37. A silicide layer 39 is formed over the source/drain regions 37. A second stress applying film (stress-liner layer) 42 is formed so as to cover the side walls 33 and 34 and the source/drain regions 37. Further, an etching stop layer 52 is formed between the gate electrode 31, the first interlayer insulating layer 41 and the first contact portions 43, and the second interlayer insulating layer 51. The semiconductor device 10 further includes a shallow trench (STI) element isolation region 22, an extension region 36, and an insulating layer 62 formed on the second interlayer insulating layer 51.

A semiconductor device manufacturing method of Example 1 is described below with reference to the schematic partial end views of the substrate and other elements illustrated in FIGS. 2A, 2B, and 2C, FIGS. 3A, 3B, and 3C, FIGS. 4A, 4B, and 4C, FIGS. 5A, 5B, and 5C, FIGS. 6A and 6B, and FIGS. 7A and 7B.

[Step-100]

The gate electrode 31 is formed on the substrate (silicon semiconductor substrate 21). The source/drain regions 37 and the channel forming region 35 are formed in the substrate (silicon semiconductor substrate 21). The first interlayer insulating layer 41 whose top face lies within the same plane as the top face of the gate electrode 31 is formed on the source/drain regions 37. As noted above, Example 1 employs the gate electrode forming method of First Embodiment. Specifically, the first interlayer insulating layer 41 whose top face lies within the same plane as the top face of the gate electrode 31 is formed on the source/drain regions 37 after forming the source/drain regions 37 and the channel forming region 35 in the substrate (silicon semiconductor substrate 21), and then the gate electrode 31 is formed on the substrate. In other words, Example 1 employs the gate-last process.

[Step-100A]

Specifically, because Example 1 employs the gate-last process, the element isolation region 22 and an active region 23 surrounded by the element isolation region 22 are first formed in the silicon semiconductor substrate 21 using a known method, and a dummy gate insulating film 72, a dummy gate electrode 71, and a hard mask film 73 are formed on the surface of the silicon semiconductor substrate 21 using a known method. The dummy gate insulating film 72 is, for example, a SiO$_2$ layer having a thickness of 1 nm to 3 nm, and can be formed using a thermal oxidation method or a CVD method. The dummy gate electrode 71 is, for example, a polysilicon layer having a thickness of 80 nm to 150 nm, and can be formed using a CVD method. The hard mask film 73 is, for example, a silicon nitride film having a thickness of about 50 nm to 150 nm, and can be formed using a CVD method.

Figure 2A:
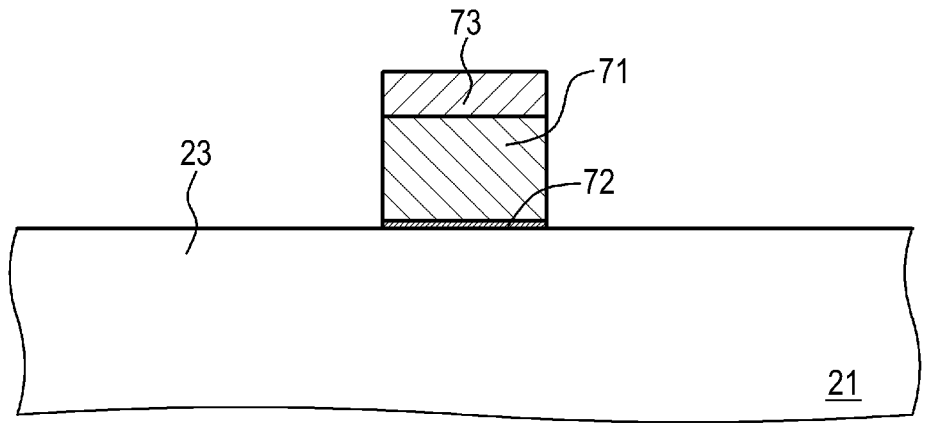
FIGS. 2A, 2B, and 2C are schematic partial end view of a substrate and other elements, explaining a semiconductor device manufacturing method of Example 1.
Figure 2B:
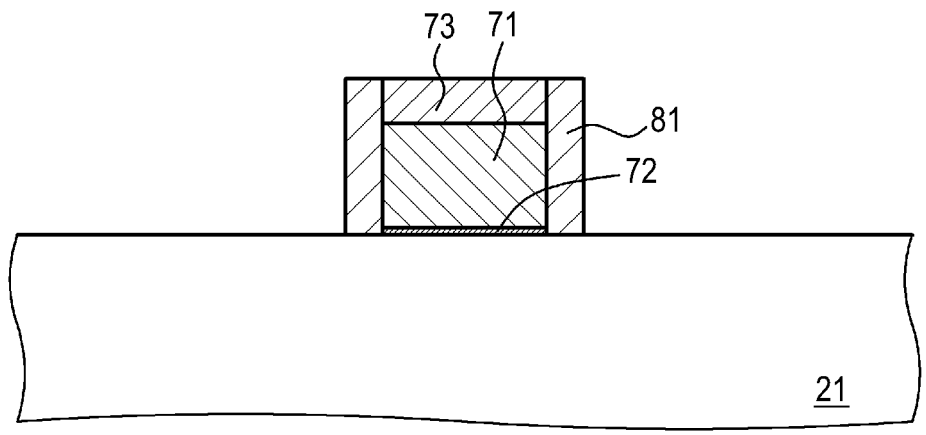

Then, the silicon nitride film, the polysilicon layer, and the dummy gate insulating film 72 are patterned using a lithography technique and an etching technique to obtain a laminate structure of the dummy gate insulating film 72, the dummy gate electrode 71, and the hard mask film 73. This state is illustrated in FIG. 2A. Specifically, the hard mask film 73 is etched by a method such as dry etching using a resist layer as an etching mask, and the resist layer is removed. Then, the polysilicon layer and the dummy gate insulating film 72 are etched using the hard mask film 73 as an etching mask. Here, the hard mask film 73, polysilicon layer, and dummy gate insulating film 72 may be etched without removing the resist layer.

[Step-100B]

Then, after forming an insulating film on the whole surface, the insulating film is etched back to remain on the side faces of the dummy gate insulating film 72, the dummy gate electrode 71, and the hard mask film 73. As a result, a dummy side-face insulating film 81 is obtained (see FIG. 2B). The insulating film is, for example, a SiN film or a SiO$_2$ film having a thickness of about 50 nm to 150 nm, and can be formed using a CVD method.

[Step-100C]

Figure 2C:
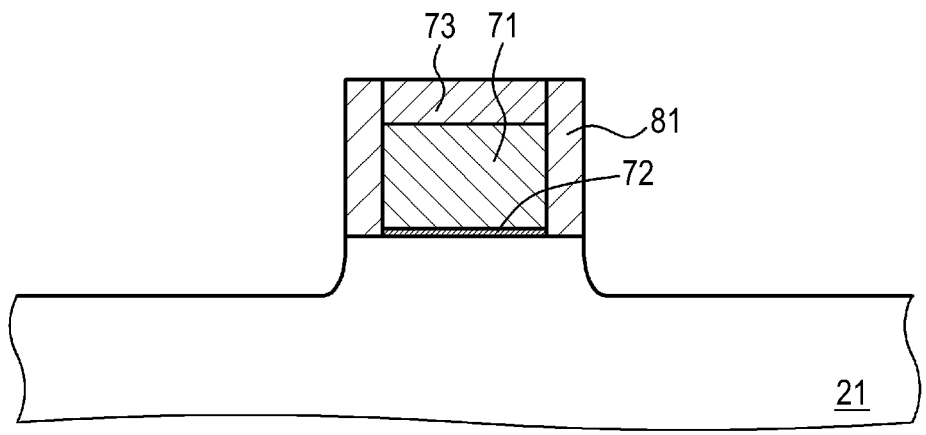

Then, the surface of the silicon semiconductor substrate 21 is etched to a depth of about 50 nm to 100 nm using a method such as dry etching (see FIG. 2C). Here, only the silicon semiconductor substrate 21 can be etched by setting a high selective ratio for the hard mask film 73 and the dummy side-face insulating film 81 with respect to the silicon semiconductor substrate 21. When the element isolation region 22 is formed, it is preferable to increase the selective ratio as much as possible for the material of the element isolation region 22. Then, the first stress applying film 38 is selectively formed on the etched region of the silicon semiconductor substrate 21 (see FIG. 3A). The first stress applying film 38 is a film of, for example, silicon germanium (SiGe) when introducing compression stress, and silicon carbide (SiC) when introducing tensile stress. The first stress applying film 38 may be formed to a thickness of about 50 nm to 200 nm using a selective epitaxial growth method.

When the first stress applying film 38 is not formed, the dummy side-face insulating film 81 is not necessary, neither is the etching of the silicon semiconductor substrate 21.

[Step-100D]

Thereafter, the source/drain regions 37 are formed.

Prior to forming the source/drain regions 37, the dummy side-face insulating film 81 is removed by wet etching, and an insulating film is formed on the whole surface. The insulating film is then etched back to remain on the side faces of the dummy gate insulating film 72, the dummy gate electrode 71, and the hard mask film 73. As a result, first side walls 33 are formed (see FIG. 3B). The insulating film is, for example, a SiN film or a SiO$_2$ film having a thickness of about 2 nm to 10 nm, and can be formed using a CVD method. The first side walls 33 may not be formed.

Figure 3A:
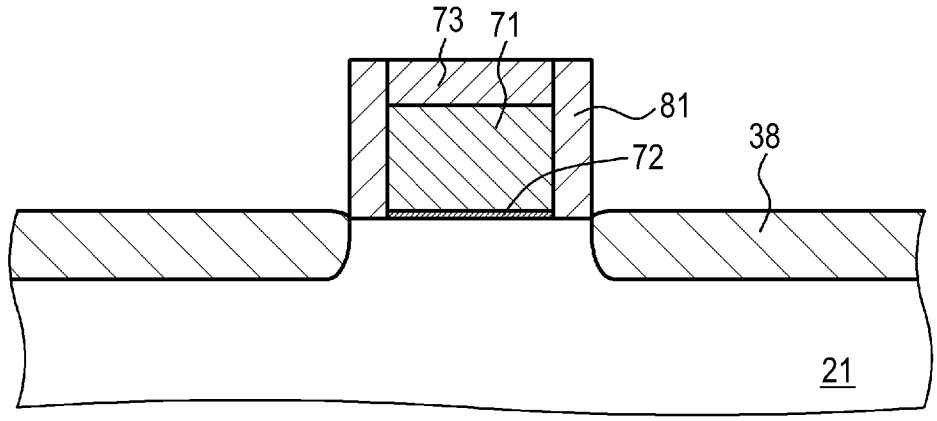
FIGS. 3A, 3B, and 3C are schematic partial end view of a substrate and other elements, explaining the semiconductor device manufacturing method of Example 1 following FIG. 2C.
Figure 3B:
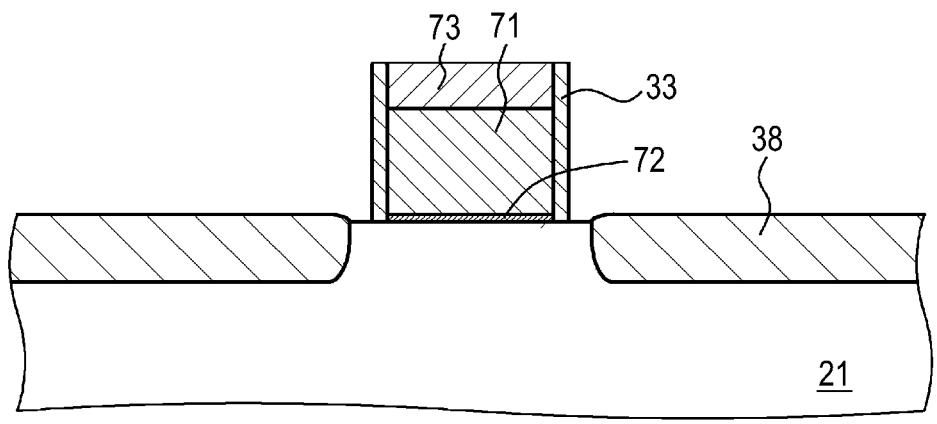
Figure 3C:
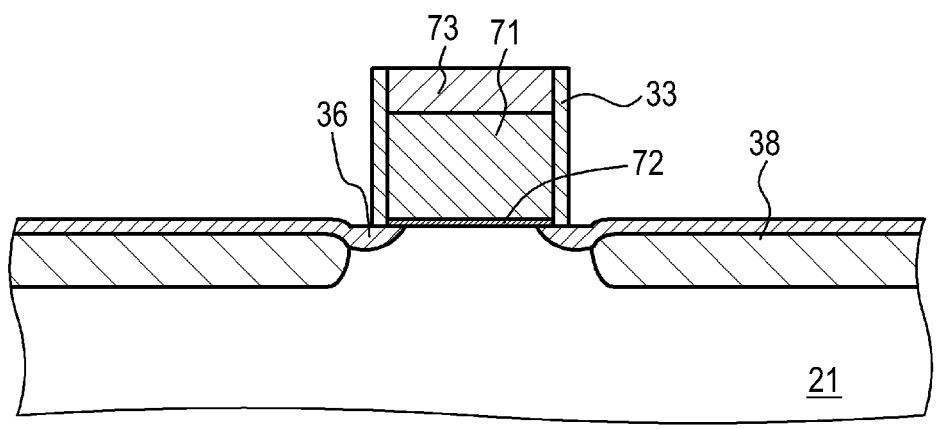

Thereafter, an extension region 36 is formed using an ion implantation method (see FIG. 3C). In the formation of the extension region 36, n-type impurities are introduced for an n-channel semiconductor device, and p-type impurities are introduced for a p-channel semiconductor device. Here, by injecting impurity ions of the conduction type opposite from that for the extension region 36 down to a position past the extension region 36, an even steeper impurity profile can be obtained in the depth direction of the extension region 36.

Figure 4A:
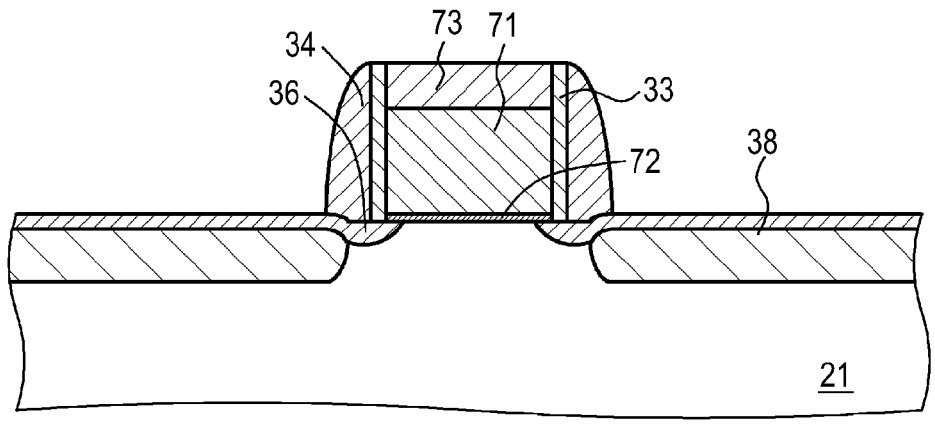
FIGS. 4A, 4B, and 4C are schematic partial end view of a substrate and other elements, explaining the semiconductor device manufacturing method of Example 1 following FIG. 3C.
Figure 4B:
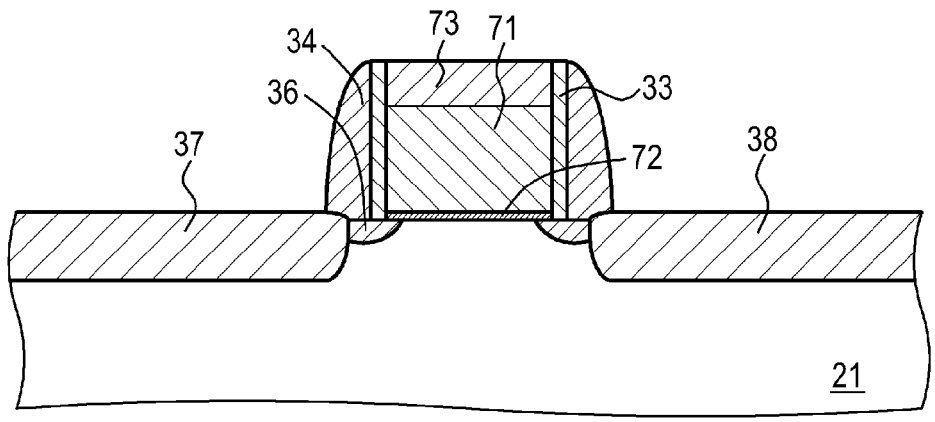

Then, an insulating film is formed on the whole surface, and etched back to form second side walls 34 on the first side walls 33 (see FIG. 4A). The insulating film is, for example, a SiN film or a SiO₂ film having a thickness of about 20 nm to 100 nm, and can be formed using a CVD method. The second side walls 34 may be formed by laminating multiple films.

Thereafter, ion implantation is performed to form the source/drain regions 37. To form the source/drain regions 37, n-type impurities are introduced for an n-channel semiconductor device, and p-type impurities are introduced for a p-channel semiconductor device. As a result, the structure illustrated in FIG. 4B can be obtained. Then, the impurities injected into the extension region 36 and the source/drain regions 37 are activated by an annealing process. The activation annealing can be performed using a rapid thermal activation (RTA) at a temperature of, for example, about 1,000° C. to 11,000° C. A laser annealing method may be used as well. For the formation of the source/drain regions 37, the first stress applying film 38 may contain n-type impurities or p-type impurities.

[Step-100E]

Figure 4C:
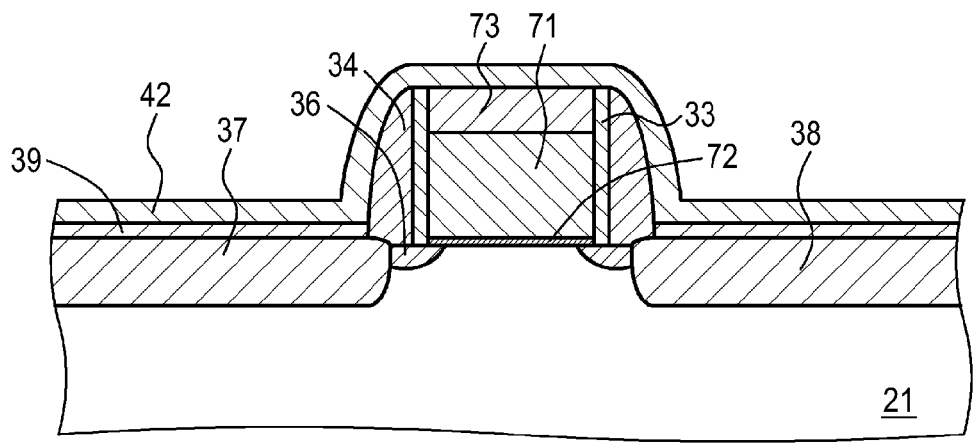

Thereafter, the silicide layer 39 is formed over the source/drain regions 37 in a thickness of about 20 nm to 70 nm using a salicide process technique, and then the second stress applying film 42 is formed over the whole surface (see FIG. 4C). The second stress applying film 42 is, for example, a silicon nitride film having a thickness of about 30 nm to 70 nm, and has a tensile stress or a compression stress of about 1.5 GPa to 2.2 GPa. For example, a second stress applying film 42 of SiN having a tensile stress, and a second stress applying film 42 of SiN having a compression stress can be obtained by appropriately selecting the deposition conditions of a plasma CVD method. It should be noted that the formation of the second stress applying film 42 is not necessary. Prior to forming the silicide layer 39, it is preferable to form a silicon layer of about 30 nm to 50 nm thick on the first stress applying film 38. In this way, a low-resistant silicide layer with a few crystal defects can be formed based on the reaction between the metal layer and the silicon layer using a salicide process technique.

[Step-100F]

Thereafter, the first interlayer insulating layer 41 is formed on the whole surface using a CVD method. The first interlayer insulating layer 41 is, for example, a TEOS film. The first interlayer insulating layer 41, the second stress applying film 42, and the hard mask film 73 are then removed by a CMP method until the top face of the dummy gate electrode 71 is exposed (see FIG. 5A).

[Step-100G]

Figure 5A:
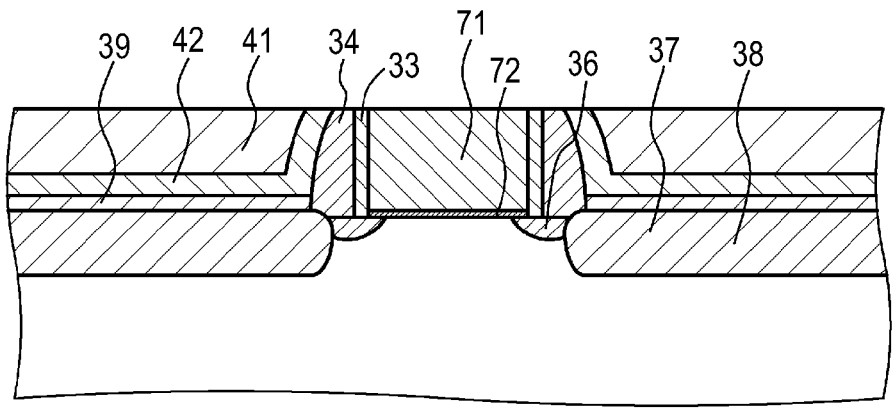
FIGS. 5A, 5B, and 5C are schematic partial end view of a substrate and other elements, explaining the semiconductor device manufacturing method of Example 1 following FIG. 4C.
Figure 5B:
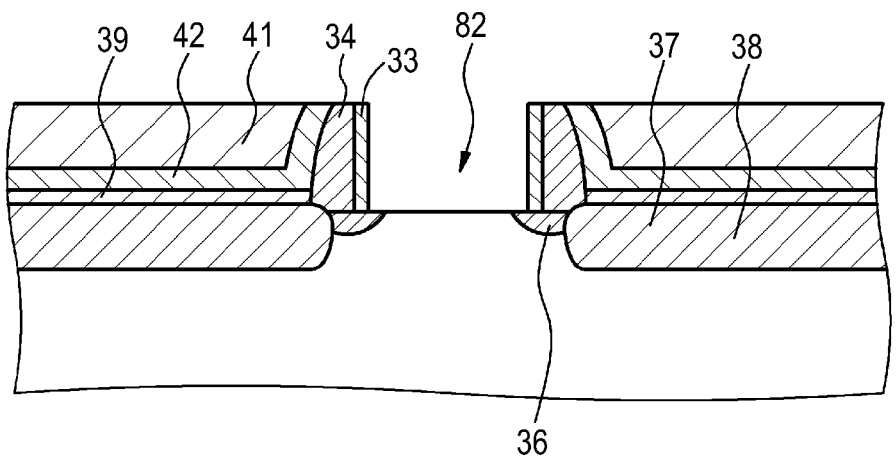
Figure 5C:
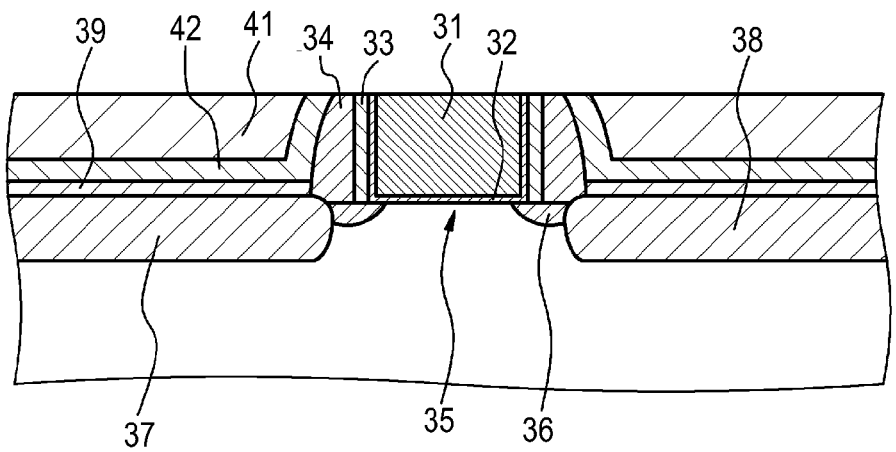

Then, the dummy gate electrode 71 and the dummy gate insulating film 72 are removed to obtain a groove 82 for the gate electrode (see FIG. 5B). The dummy gate electrode 71 can be selectively removed using, for example, dry etching. The dummy gate insulating film 72 can be selectively removed using, for example, dry etching or wet etching.

[Step-100H]

Thereafter, the gate insulating film 32 and the gate electrode 31 are formed in the groove 82 for the gate electrode. Specifically, a hafnium oxide (HfO₂) film having a thickness of about 1 nm to 3 nm is deposited on the whole surface, and after depositing a conductive material layer used to form the gate electrode 31, the conductive material layer and the hafnium oxide film on the first interlayer insulating layer 41, the first side walls 33, and the second side walls 34 are removed by a CMP method. As a result, the structure illustrated in FIG. 5C can be obtained. Here, the top face of the gate electrode 31 and the top face of the first interlayer insulating layer 41 lie within the same plane.

[Step-110I]

Figure 6A:
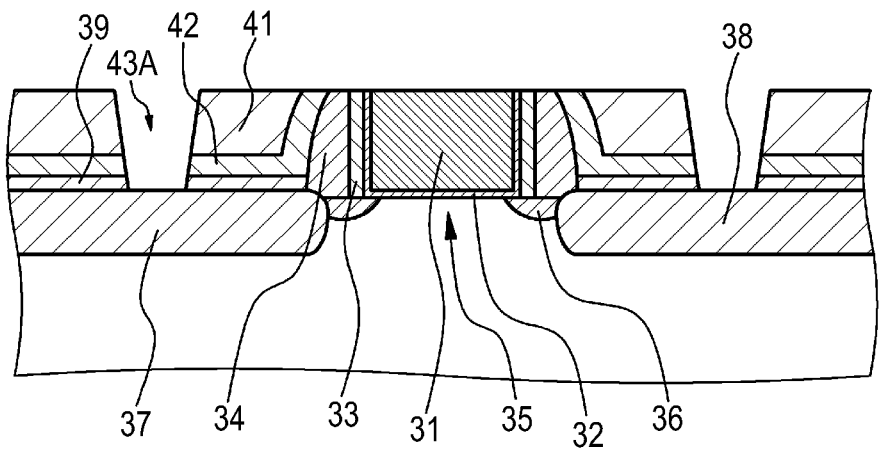
FIGS. 6A and 6B are schematic partial end view of a substrate and other elements, explaining the semiconductor device manufacturing method of Example 1 following FIG. 5C.
Figure 6B:
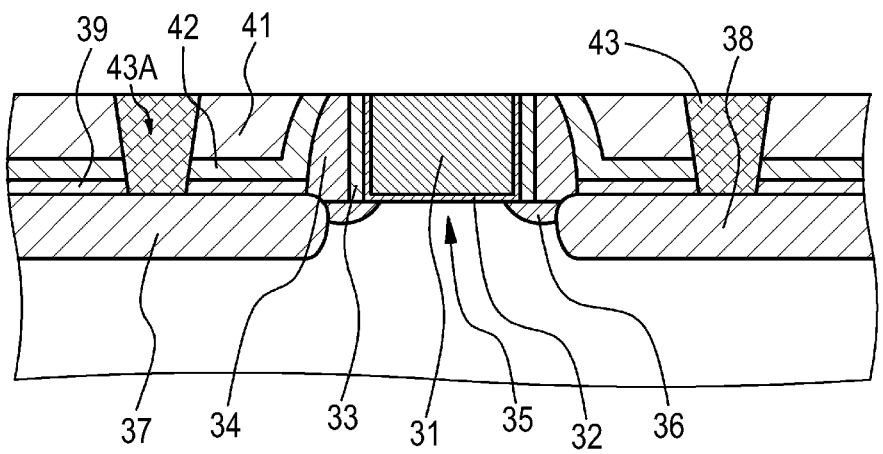

Thereafter, the first contact portions 43 having a groove shape and connected to the source/drain regions 37 are formed in the first interlayer insulating layer 41. Specifically, a resist layer is formed on the first interlayer insulating layer 41, and groove-shaped opening portions are formed in the resist layer using a lithography technique. The first interlayer insulating layer 41 is then etched using the resist layer as an etching mask, and the resist layer is removed. As a result, as illustrated in FIG. 6A, groove-shaped opening portions 43A used to form the first contact portions 43 can be formed in the first interlayer insulating layer 41.

Thereafter, a Ti layer, a TiN layer, and a tungsten layer are sequentially formed on the whole surface using a sputtering method, and the tungsten layer, the TiN layer, and the Ti layer on the first interlayer insulating layer 41 are removed by a CMP method. As a result, the first contact portions 43 having a groove shape and connected to the source/drain regions 37 are formed in the groove-shaped opening portions 43A (see FIG. 6B). Note that, in the drawings, the first contact portions 43 and the second contact portion are shown in single layers. Here, the top faces of the gate electrode 31, the first contact portions 43, and the first interlayer insulating layer 41 lie within the same plane. The deposition conditions of the sputtering method for the tungsten layer in the cases of the n-channel semiconductor device and the p-channel semiconductor device are presented below. Note that the first contact portions 43 may extend onto the element isolation region 22, or may be formed only on the source/drain regions 37. When the first contact portions 43 are formed to extend onto the element isolation region 22, the leak current due to the defects that occur in the silicon semiconductor substrate 21 in contact with the element isolation region 22 can be suppressed.

n-Channel Semiconductor Device

| Power: | 1 kW |
|---|---|
| Process gas: | Argon gas/45 sccm |
| Tensile stress: | 1.5 GPa | p-Channel Semiconductor Device

| Power: | 9 kW |
|---|---|
| Process gas: | Argon gas/45 sccm |
| Compression stress: | 1.0 GPa |

[Step-120]

Then, the etching stop layer 52 of SiN having a thickness of about 20 nm to 50 nm is formed on the whole surface, followed by formation of the second interlayer insulating layer 51 of SiO₂. The formation of the etching stop layer 52 is not necessary.

[Step-130]

Figure 7A:
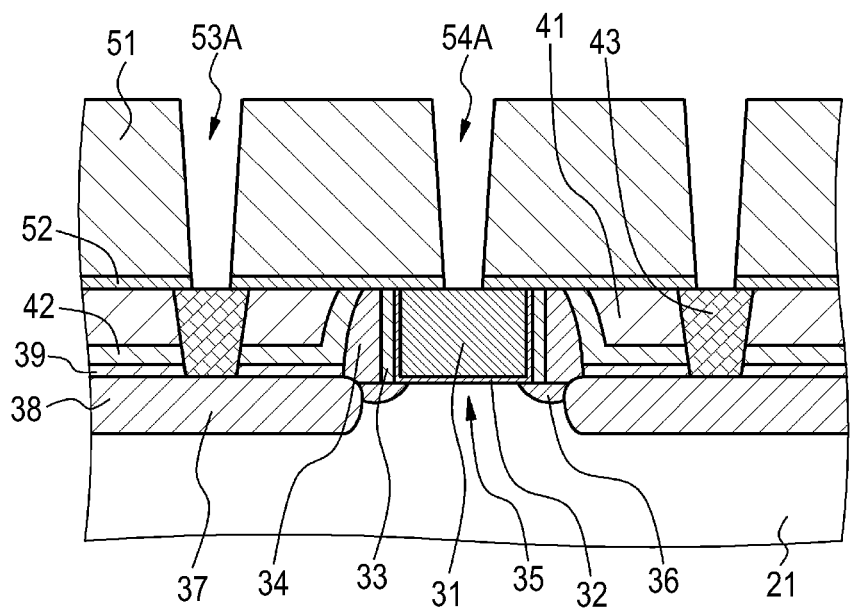
FIGS. 7A and 7B are schematic partial end view of a substrate and other elements, explaining the semiconductor device manufacturing method of Example 1 following FIG. 6B.
Figure 7B:
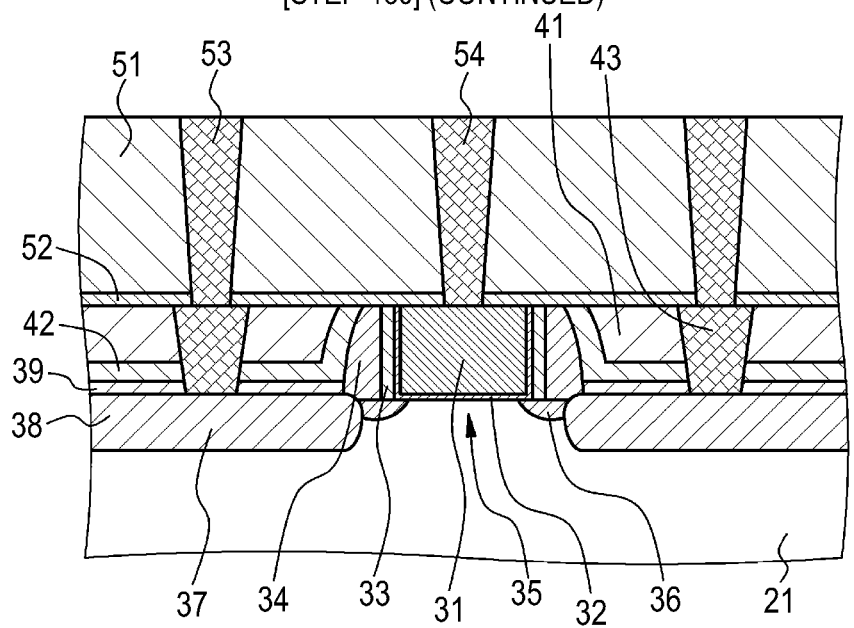

Thereafter, a resist layer is formed on the second interlayer insulating layer 51, and hole-shaped opening portions are formed in the resist layer using a lithography technique. The second interlayer insulating layer 51 and the etching stop layer 52 are then etched using the resist layer as an etching mask, and the resist layer is removed. As a result, as illustrated in FIG. 7A, hole-shaped opening portions 53A used to form the second contact portions 53 are formed in portions of the second interlayer insulating layer 51 above the first contact portions 43. Concurrently, a hole-shaped opening portion 54A used to form the third contact portion 54 may be formed in a portion of the second interlayer insulating layer 51 above the gate electrode 31.

Then, a Ti layer and a TiN layer are sequentially formed on the whole surface using a sputtering method, and after forming a tungsten layer on the whole surface using a CVD method, the tungsten layer, the TiN layer, and the Ti layer on the second interlayer insulating layer 51 are removed by a CMP method. As a result, the second contact portions 53 having the shape of holes and connected to the first contact portions 43 are formed in the hole-shaped opening portions 53A (see FIG. 7B). Concurrently, a hole-shaped third contact portion 54 connected to the gate electrode 31 may be formed in the hole-shaped opening portion 54A.

[Step-140]

Thereafter, the wires 61 connected to the second contact portions 53 and the third contact portion 54 are formed on the second interlayer insulating layer 51 using a known method based on a damascene process.

In the semiconductor device and the semiconductor device manufacturing method of Example 1, the contact resistance between the source/drain regions 37 and the first contact portions 43 can be reduced by the provision of the groove-shaped first contact portions 43 connected to the source/drain regions 37. Further, because the hole-shaped second contact portions 53 connected to the first contact portions 43 are provided and exposed on the top face of the second interlayer insulating layer 51, the wires 61 formed on the second interlayer insulating layer 51 can be designed with more freedom, and do not need to extend a long distance. Further, because the top faces of the gate electrode 31, the first contact portions 43, and the first interlayer insulating layer 41 lie within the same plane, the second interlayer insulating layer 51 can be etched by the same thickness when the hole-shaped third contact portion 54 and the second contact portions 53 are simultaneously formed on the gate electrode 31 and the source/drain regions 37. There accordingly will be no etching damage to the gate electrode 31. Further, because the hole-shaped second contact portions 53 are provided on the groove-shaped first contact portions 43, position misregistration is unlikely to occur. Further, because circuit miniaturization does not easily lead to shorting between the contact portions, the device and method are suitable for miniaturization process, and thus enable a reduction in circuit area. Further, mobility can be improved both in the n-channel and the p-channel semiconductor devices by the configuration in which the first contact portions of these different types of semiconductor devices are adapted to have a tensile stress and a compression stress, respectively.

EXAMPLE 2

Example 2 is a variation of the semiconductor device manufacturing method of Example 1. Example 2 employs the gate electrode forming method of Second Embodiment. Specifically, a gate electrode 131 is formed on a substrate (silicon semiconductor substrate), and after forming source/drain regions 37 and a channel forming region 35 in the substrate, a first interlayer insulating layer 41 whose top face lies within the same plane as the top face of the gate electrode 131 is formed on the source/drain regions 37. Note that Example 2 differs from Example 1 in that the gate insulating film 132 does not extend between the first interlayer insulating layer 41 and the gate electrode 131.

The semiconductor device manufacturing method of Example 2 is described below with reference to the schematic partial end views of the substrate and other elements illustrated in FIGS. 8A, 8B, and 8C, FIGS. 9A, 9B, and 9C, FIGS. 10A, 10B, and 10C, FIGS. 11A, 11B, and 11C, and FIGS. 12A and 12B.

[Step-200]

First, the gate electrode 131 is formed on the substrate (silicon semiconductor substrate 21), and after forming the source/drain regions 37 and the channel forming region 35 in the substrate (silicon semiconductor substrate 21), the first interlayer insulating layer 41 whose top face lies within the same plane as the top face of the gate electrode 131 is formed on the source/drain regions 37.

[Step-200A]

Figure 8A:
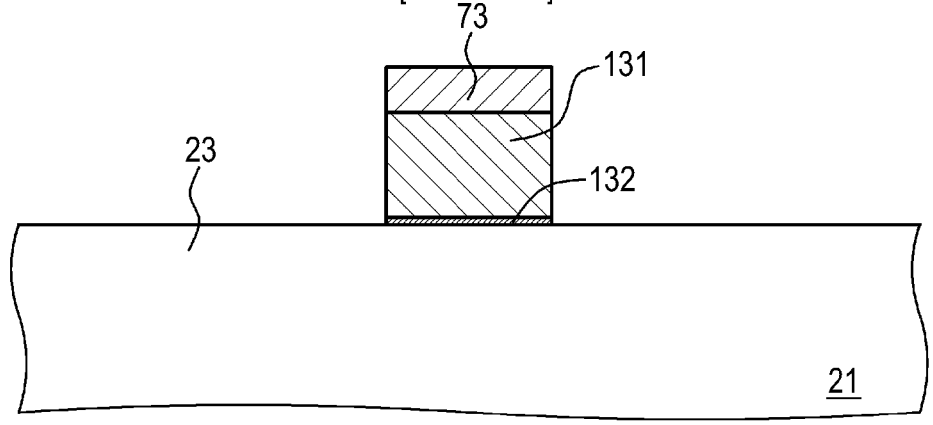
FIGS. 8A, 8B, and 8C are schematic partial end view of a substrate and other elements, explaining a semiconductor device manufacturing method of Example 2.
Figure 8B:
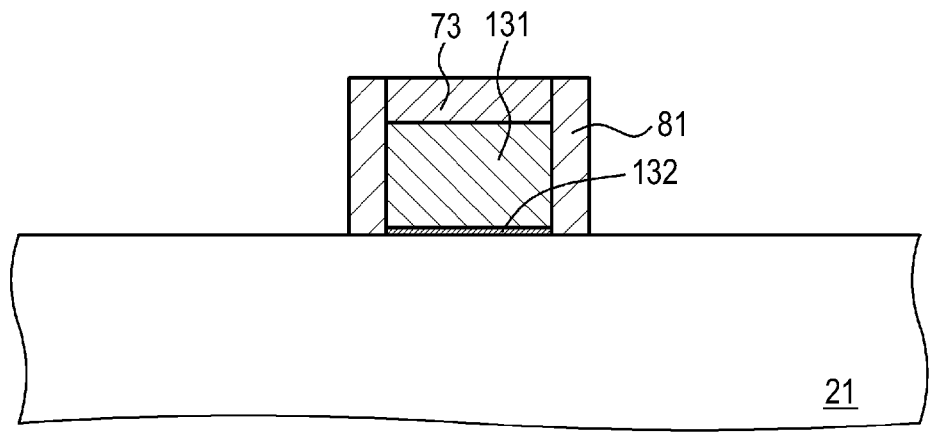
Figure 8C:
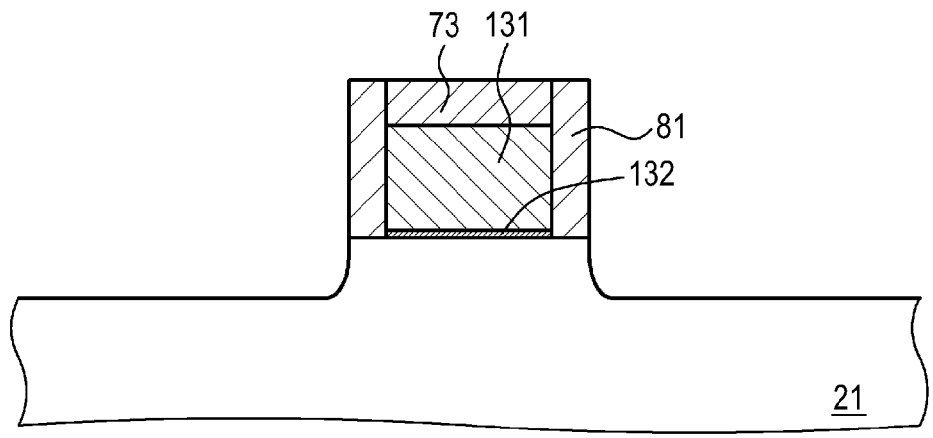

Specifically, an element isolation region 22, and an active region 23 surrounded by the element isolation region 22 are formed in the silicon semiconductor substrate 21 using a known method, and then the gate insulating film 132, the gate electrode 131, and the hard mask film 73 are formed on the surface of the silicon semiconductor substrate 21 using a known method (see FIG. 8A). This step can be regarded as being essentially the same as Step-100A of Example 1, except that the gate insulating film 132 replaces the dummy gate insulating film 72, and that the gate electrode 131 replaces the dummy gate electrode 71.

[Step-200B]

Then, as in Step-100B of Example 1, the insulating film is formed on the whole surface, and etched back to remain on the side faces of the gate insulating film 132, the gate electrode 131, and the hard mask film 73. As a result, a dummy side-face insulating film 81 is obtained (see FIG. 8B).

[Step-200C]

Figure 9A:
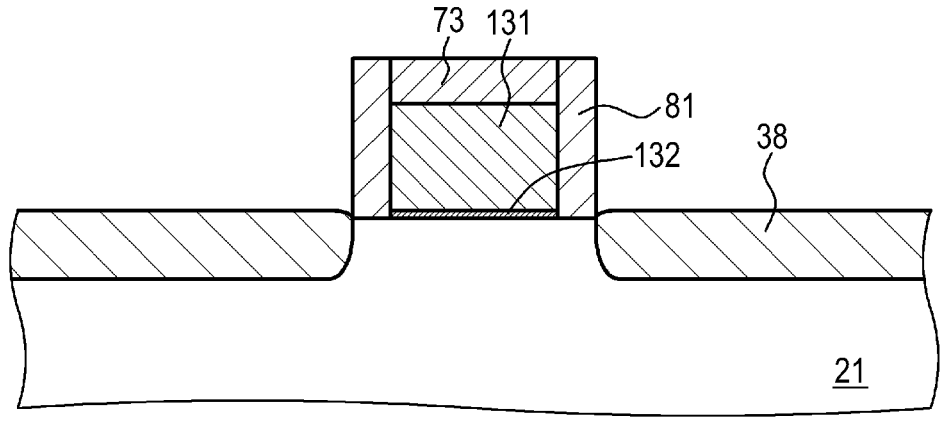
FIGS. 9A, 9B, and 9C are schematic partial end view of a substrate and other elements, explaining the semiconductor device manufacturing method of Example 2 following FIG. 8C.
Figure 9B:
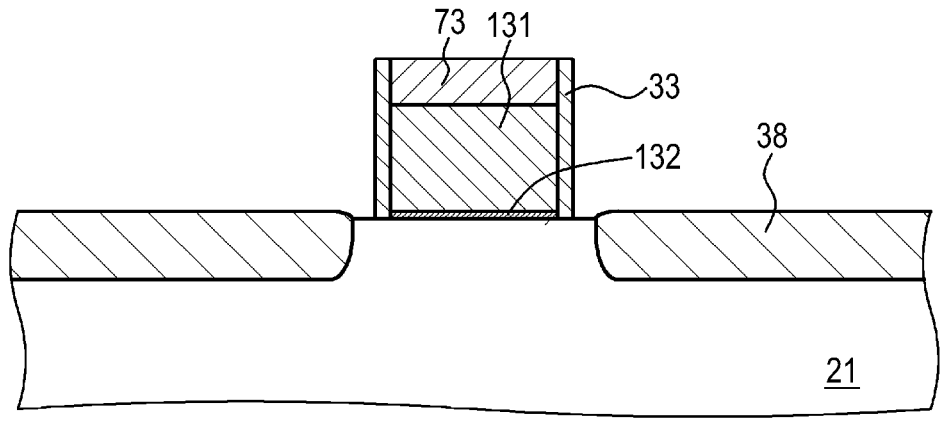
Figure 9C:
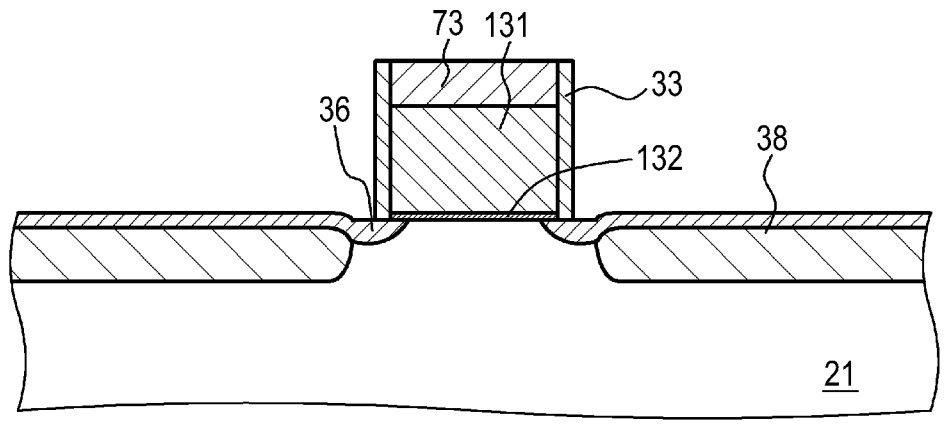

Thereafter, as in Step-100C of Example 1, the surface of the silicon semiconductor substrate 21 is etched to a depth of about 50 nm to 100 nm using a method such as dry etching (see FIG. 8C), and the first stress applying film 38 is selectively formed on the etched region of the silicon semiconductor substrate 21 (see FIG. 9A).

[Step-200D]

Then, the source/drain regions 37 are formed. Prior to forming the source/drain regions 37, as in Step-100D of Example 1, the dummy side-face insulating film 81 is removed by wet etching. Thereafter, an insulating film is formed on the whole surface, and etched back to remain on the side faces of the gate insulating film 132, the gate electrode 131, and the hard mask film 73. As a result, first side walls 33 are formed (see FIG. 9B). Then, an extension region 36 is formed using an ion implantation method (see FIG. 9C). This is followed by formation of an insulating film on the whole surface, and the insulating film is etched back to form second side walls 34 on the first side walls 33 (see FIG. 10A). Thereafter, ion implantation is performed to form the source/drain regions 37. As a result, the structure illustrated in FIG. 10B can be obtained. The impurities injected into the extension region 36 and the source/drain regions 37 are activated by an annealing process.

[Step-200E]

Figure 10A:
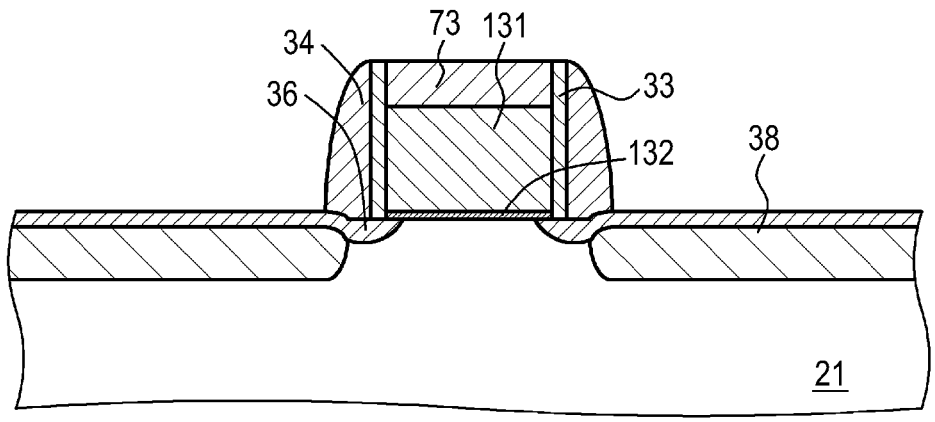
FIGS. 10A, 10B, and 10C are schematic partial end view of a substrate and other elements, explaining the semiconductor device manufacturing method of Example 2 following FIG. 9C.
Figure 10B:
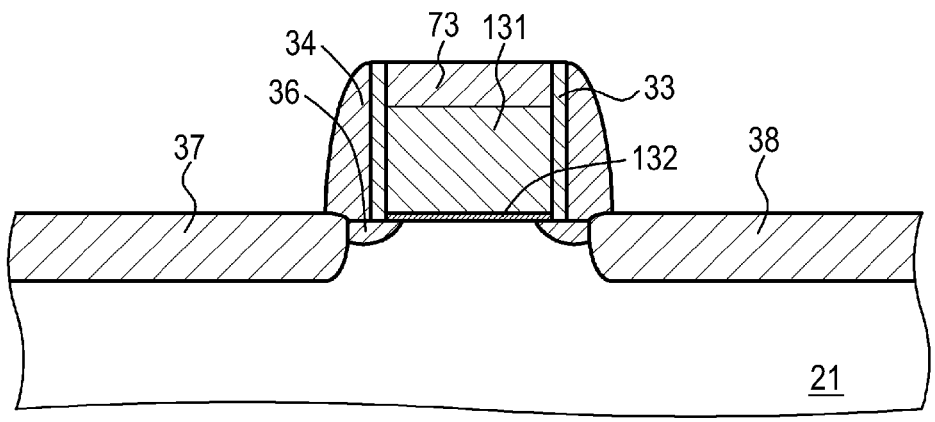
Figure 10C:
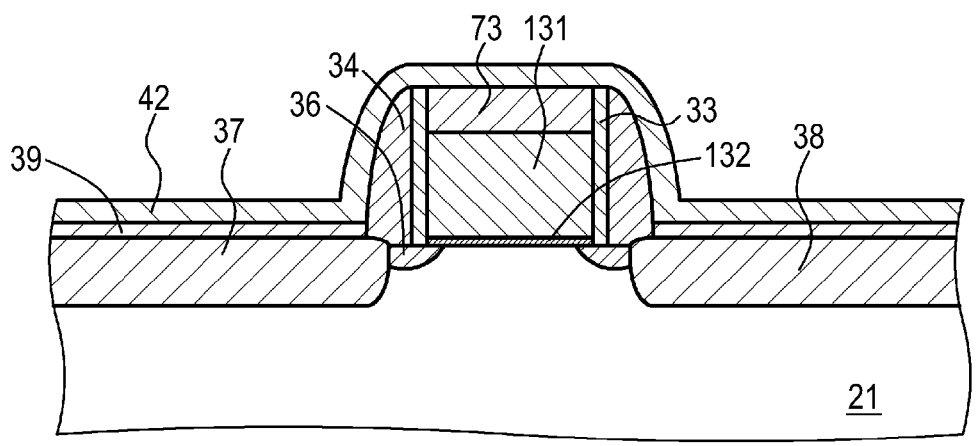
Figure 11A:
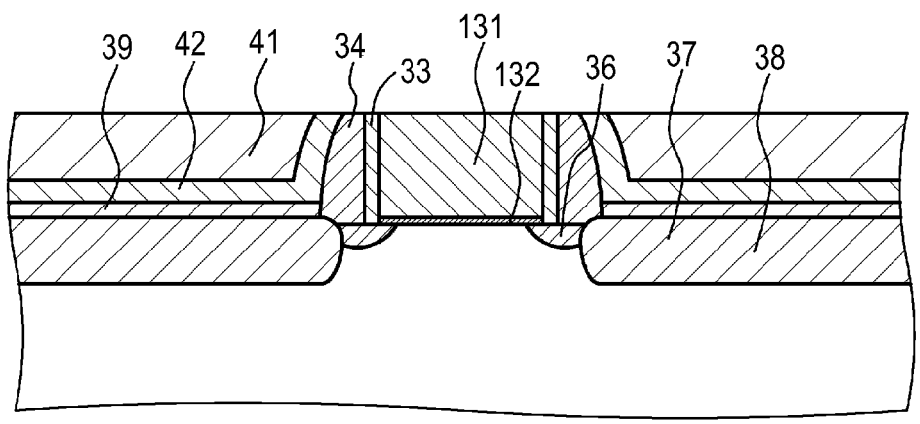
FIGS. 11A, 11B, and 11C are schematic partial end view of a substrate and other elements, explaining the semiconductor device manufacturing method of Example 2 following FIG. 10C.
Figure 11B:
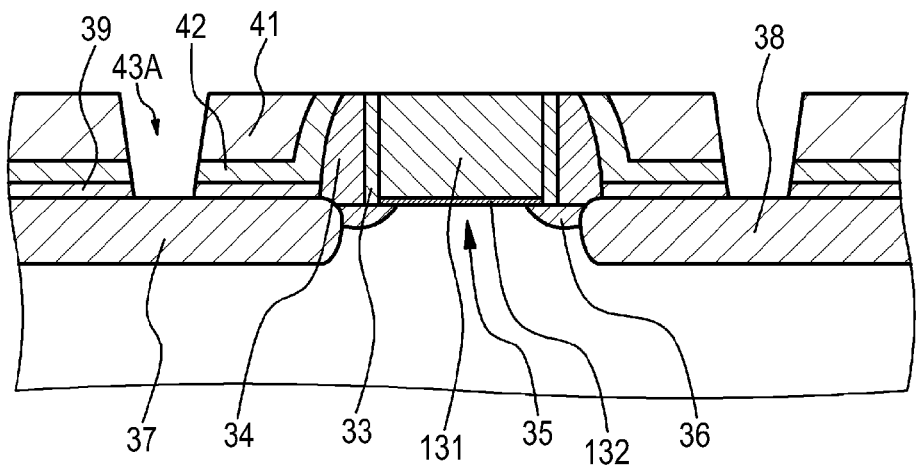
Figure 11C:
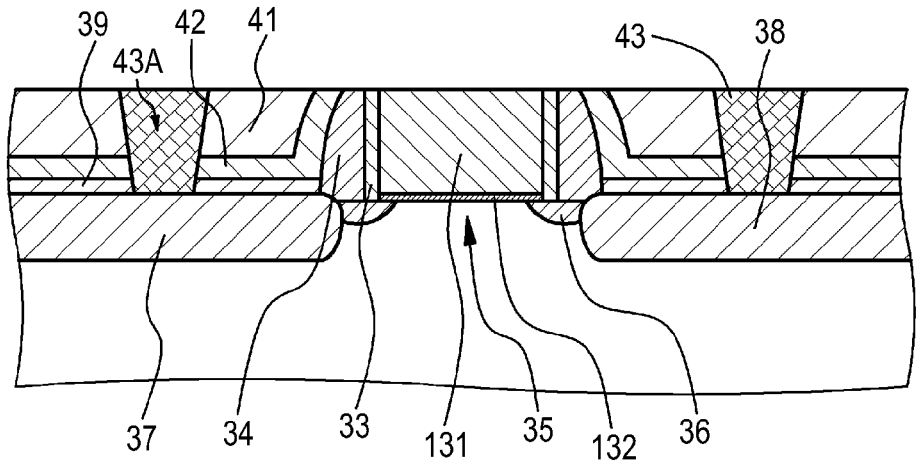

Then, as in Step-100E of Example 1, a silicide layer 39 having a thickness of about 20 nm to 70 nm is formed over the source/drain regions 37 using a known method based on a salicide process technique, and a second stress applying film 42 is formed on the whole surface (see FIG. 10C).

[Step-200F]

Thereafter, as in Step-100F of Example 1, the first interlayer insulating layer 41 is formed on the whole surface using a CVD method. The first interlayer insulating layer 41, the second stress applying film 42, and the hard mask film 73 are then removed by a CMP method until the top face of the gate electrode 131 is exposed (see FIG. 11A).

[Step-210]

Then, as in Step-110I of Example 1, first contact portions 43 of a groove shape connected to the source/drain regions 37 are formed in the groove-shaped opening portions 43A formed in the first interlayer insulating layer 41. In Example 2, this is performed without removing the gate electrode 131 and the gate insulating film 132 (see FIGS. 11B and 11C). Here, the top faces of the gate electrode 131, the first contact portions 43, and the first interlayer insulating layer 41 lie within the same plane. Note that the first contact portions 43 may extend onto the element isolation region 22, or may be formed only on the source/drain regions 37.

[Step-220]

Thereafter, as in Step-120 of Example 1, an etching stop layer 52 of SiN having a thickness of about 20 nm to 50 nm is formed on the whole surface, and a second interlayer insulating layer 51 of $SiO_2$ is formed. Note that the formation of the etching stop layer 52 is not necessary.

[Step-230]

Figure 12A:
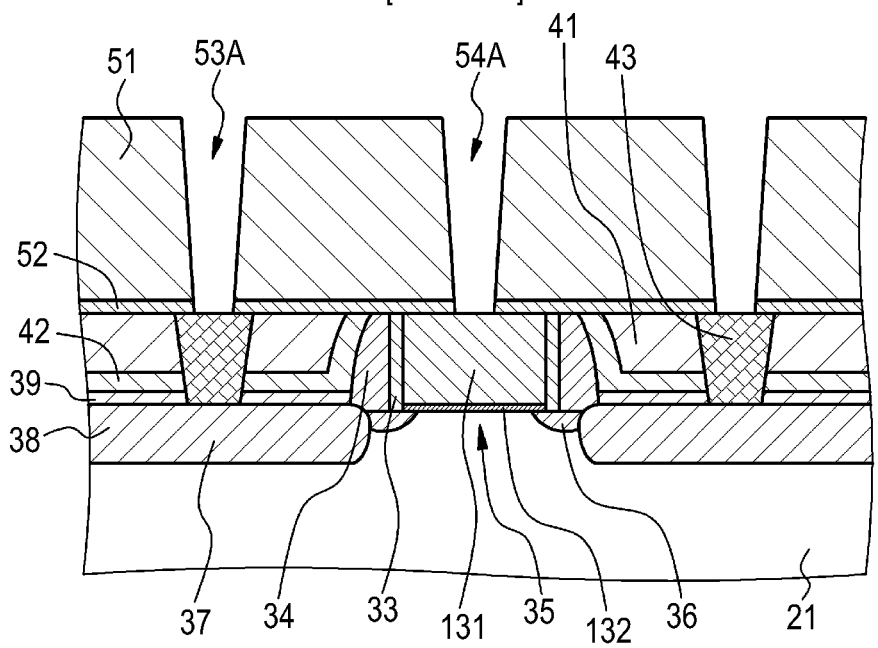
FIGS. 12A and 12B are schematic partial end view of a substrate and other elements, explaining the semiconductor device manufacturing method of Example 2 following FIG. 11C.
Figure 12B:
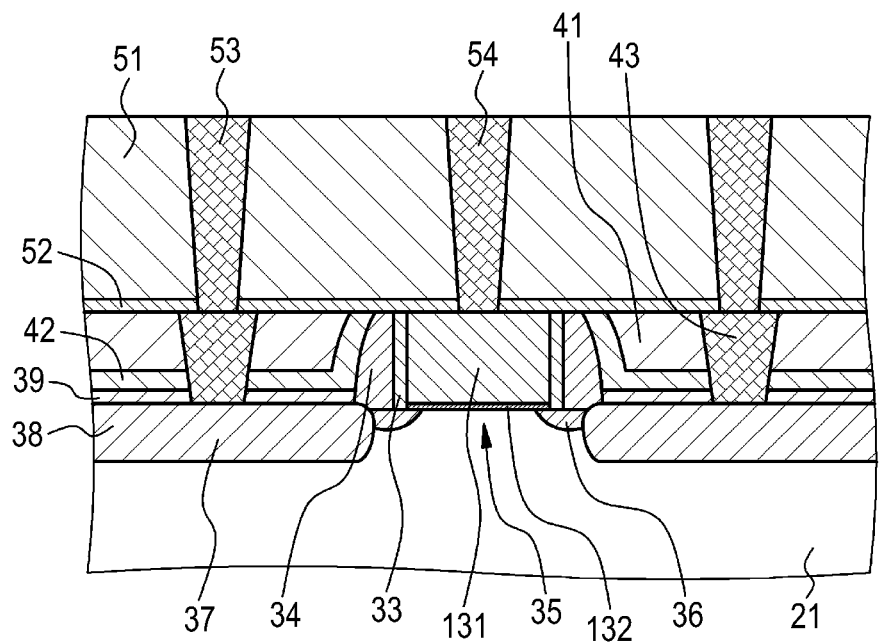

Thereafter, as in Step-130 of Example 1, second contact portions 53 having the shape of holes and connected to the first contact portions 43 are formed in the hole-shaped opening portions 53A (see FIGS. 12A and 12B). Concurrently, a hole-shaped third contact portion 54 connected to the gate electrode 131 may be formed in the hole-shaped opening portion 54A.

[Step-240]

Then, the wires 61 connected to the second contact portions 53 and the third contact portion 54 are formed on the second interlayer insulating layer 51 using a known method based on a damascene process.

EXAMPLE 3

Example 3 concerns the semiconductor device and the semiconductor device manufacturing method according to Second Embodiment of the present invention. Example 3 employs the gate electrode forming method of First Embodiment. The semiconductor device of Example 3 is a CMOS-type semiconductor device of a dual gate structure, and includes an n-channel semiconductor device and a p-channel semiconductor device. The structures and configurations of the n-channel semiconductor device and the p-channel semiconductor device are the same as those of the semiconductor device 10 described in Example 1, and detailed descriptions thereof are omitted here.

Figure 13:
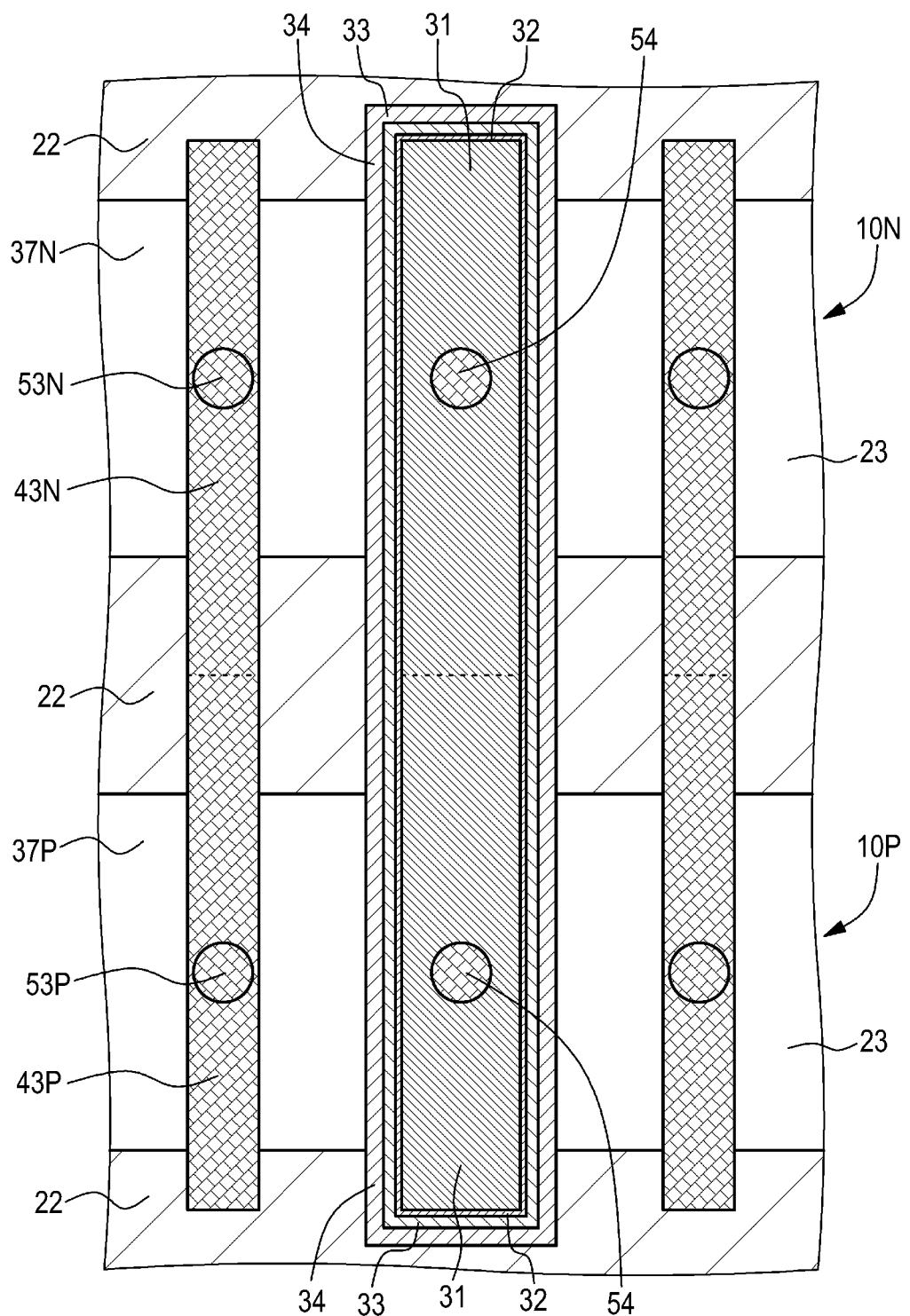
FIG. 13 is a schematic diagram illustrating the layout of each constituting element of a semiconductor device of Example 3 as viewed from above.

FIG. 13 schematically illustrate the layout of each constituting element of the semiconductor device of Example 3 as viewed from above. As illustrated in the figure, an n-channel semiconductor device 10N and a p-channel semiconductor device 10P have first contact portions 43N and 43P, respectively, that are groove-shaped and join together on the element isolation region 22. The n-channel semiconductor device 10N and the p-channel semiconductor device 10P also have hole-shaped second contact portions 53N and 53P, respectively. The first contact portions 43N of the n-channel semiconductor device 10N have a tensile stress, and the first contact portions 43P of the p-channel semiconductor device 10P have a compression stress.

In Example 3, as in Example 1, a stress applying film is formed between the first interlayer insulating layer 41 and the source/drain regions 37N and 37P of the n-channel semiconductor device 10N and the p-channel semiconductor device 10P. An etching stop layer is formed on the first interlayer insulating layer 41, and a second interlayer insulating layer 51 is formed on the etching stop layer.

The semiconductor device manufacturing method of Example 3 is described below with reference to FIG. 14 to FIG. 18 that schematically illustrate the layout of each constituting element of the semiconductor device of Example 3 as viewed from above.

[Step-300]

The gate electrode 31 is formed on a substrate (silicon semiconductor substrate 21) for each of the n-channel semiconductor device 10N and the p-channel semiconductor device 10P. The source/drain regions 37N and 37P, and the channel forming region are formed in the substrate for each of the n-channel semiconductor device 10N and the p-channel semiconductor device 10P. A first interlayer insulating layer 41 whose top face lies within the same plane as the top faces of the gate electrodes 31 is formed on the source/drain regions 37N and 37P of the n-channel semiconductor device 10N and the p-channel semiconductor device 10P.

As noted above, Example 3 employs the gate electrode forming method of First Embodiment. Specifically, the source/drain regions 37N and 37P, and the channel forming region are formed in the substrate (silicon semiconductor substrate) for each of the n-channel semiconductor device 10N and the p-channel semiconductor device 10P, and the first interlayer insulating layer 41 whose top face lies within the same plane as the top faces of the gate electrodes 31 is formed on the source/drain regions 37N and 37P of the n-channel semiconductor device 10N and the p-channel semiconductor device 10P. The gate electrode 31 is then formed on the substrate for each of the n-channel semiconductor device 10N and the p-channel semiconductor device 10P.

In other words, Step-100A to Step-100H described in Example 1 are appropriately performed for the n-channel semiconductor device 10N and the p-channel semiconductor device 10P. Specifically, in a step analogous to Step-100A, the element isolation region 22 and the active region 23 are formed for each of the n-channel semiconductor device 10N and the p-channel semiconductor device 10P using a known method, and a dummy gate insulating film, a dummy gate electrode, and a hard mask film are formed on the surface of the silicon semiconductor substrate 21 for each of the n-channel semiconductor device 10N and the p-channel semiconductor device 10P using a known method. Then, in a step analogous to Step-100B, a dummy side-face insulating film is formed for each of the n-channel semiconductor device 10N and the p-channel semiconductor device 10P, and a first stress applying film is formed for each of the n-channel semiconductor device 10N and the p-channel semiconductor device 10P in a step analogous to Step-100C. Thereafter, in a step analogous to Step-100D, the source/drain regions 37N and 37P are formed for the n-channel semiconductor device 10N and the p-channel semiconductor device 10P, respectively. Then, after forming a silicide layer over the source/drain regions 37N and 37P of the n-channel semiconductor device 10N and the p-channel semiconductor device 10P in a step analogous to Step-100E, a second stress applying film is formed on the whole surface. Thereafter, in a step analogous to Step-100F, the first interlayer insulating layer 41 is formed on the whole surface. Then, in a step analogous to Step-100G, the dummy gate electrode and the dummy gate insulating film are removed to obtain grooves for the gate electrodes. Thereafter, in a step analogous to Step-100H, the gate insulating film 32 and the gate electrode 31 are formed in the gate electrode grooves for each of the n-channel semiconductor device 10N and the p-channel semiconductor device 10P.

[Step-310]

Thereafter, in a step analogous to Step-110I, first contact portions 43N and 43P having a groove shape and connected to the source/drain regions 37N and 37P are formed in the first interlayer insulating layer 41 for the n-channel semiconductor device 10N and the p-channel semiconductor device 10P.

Figure 14:
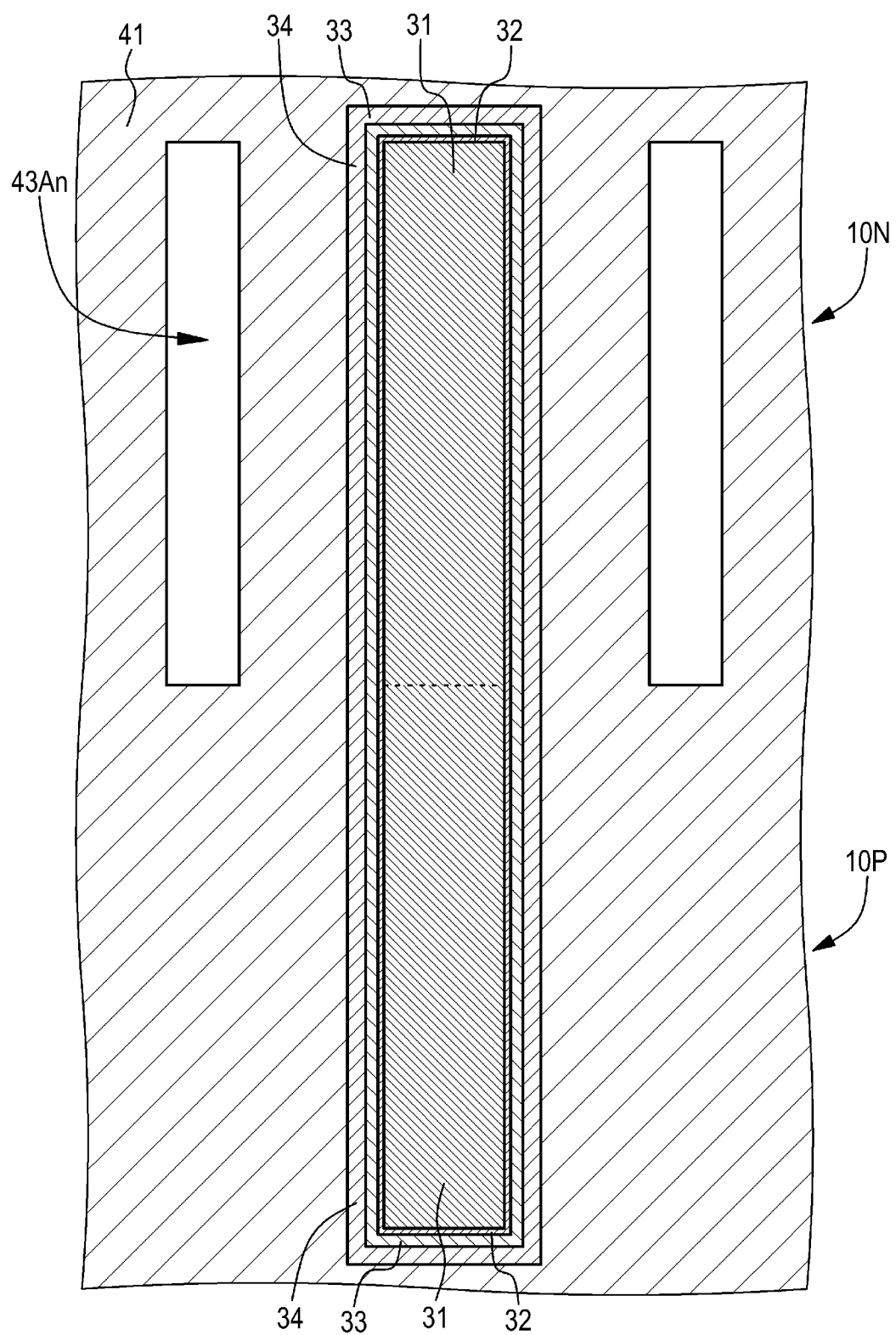
FIG. 14 is a schematic diagram illustrating the layout of each constituting element of the semiconductor device of Example 3, explaining a semiconductor device manufacturing method of Example 3.
Figure 15:
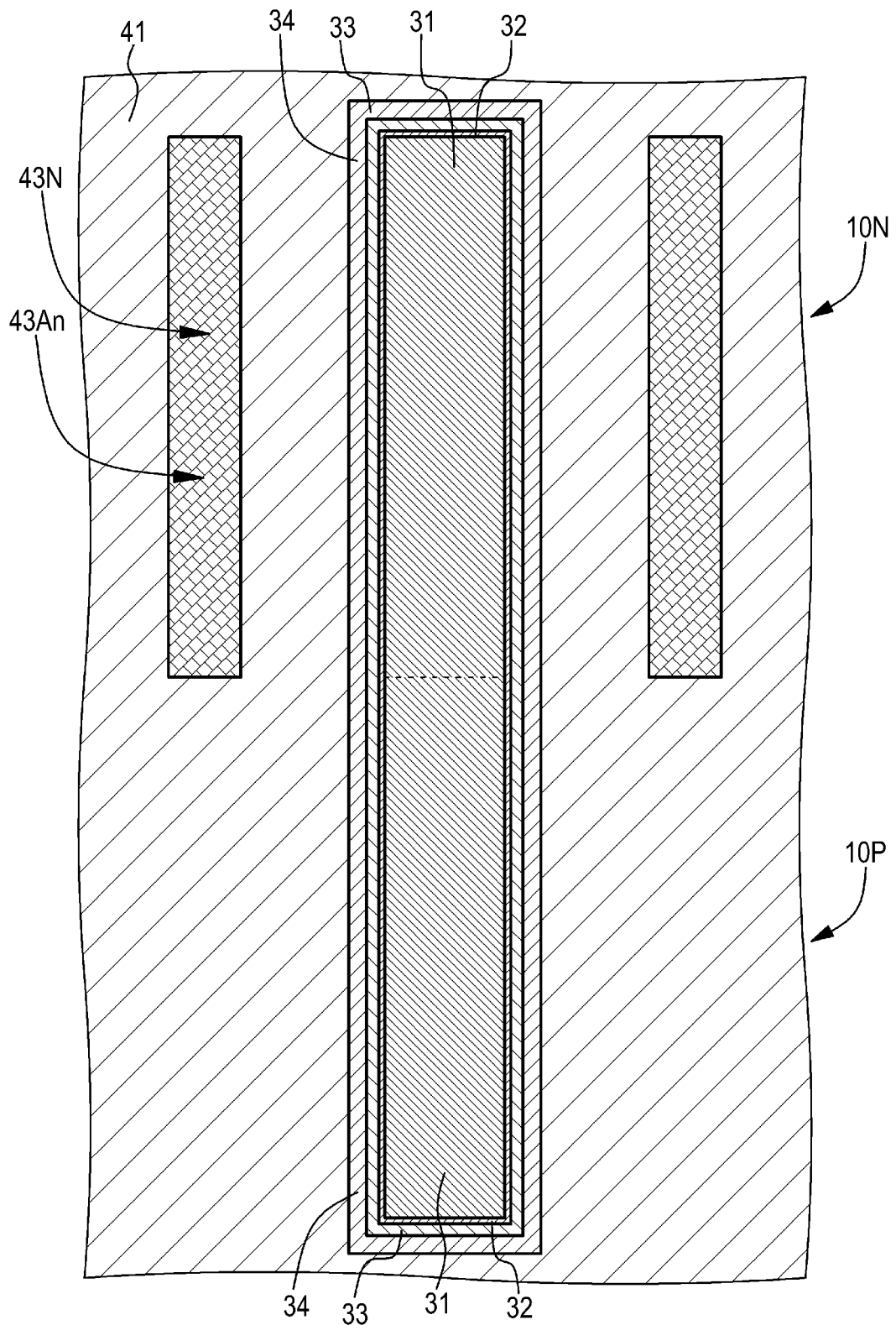
FIG. 15 is a schematic diagram illustrating the layout of each constituting element of the semiconductor device of Example 3, explaining the semiconductor device manufacturing method of Example 3 following FIG. 14.

Specifically, a resist layer is formed on the first interlayer insulating layer 41, and groove-shaped opening portions are formed in the resist layer using a lithography technique. The first interlayer insulating layer 41 is then etched using the resist layer as an etching mask, and the resist layer is removed. As a result, as illustrated in FIG. 14, groove-shaped opening portions 43 $A_n$ used to form the first contact portions 43N for the n-channel semiconductor device 10N are formed in the first interlayer insulating layer 41.

Thereafter, a Ti layer, a TiN layer, and a tungsten layer are sequentially formed on the whole surface using a sputtering method, and the tungsten layer, the TiN layer, and the Ti layer on the first interlayer insulating layer 41 are removed by a CMP method. As a result, the first contact portions 43N having a groove shape and connected to the source/drain regions 37N are formed in the groove-shaped opening portions $43A_n$ (see FIG. 15).

Figure 16:
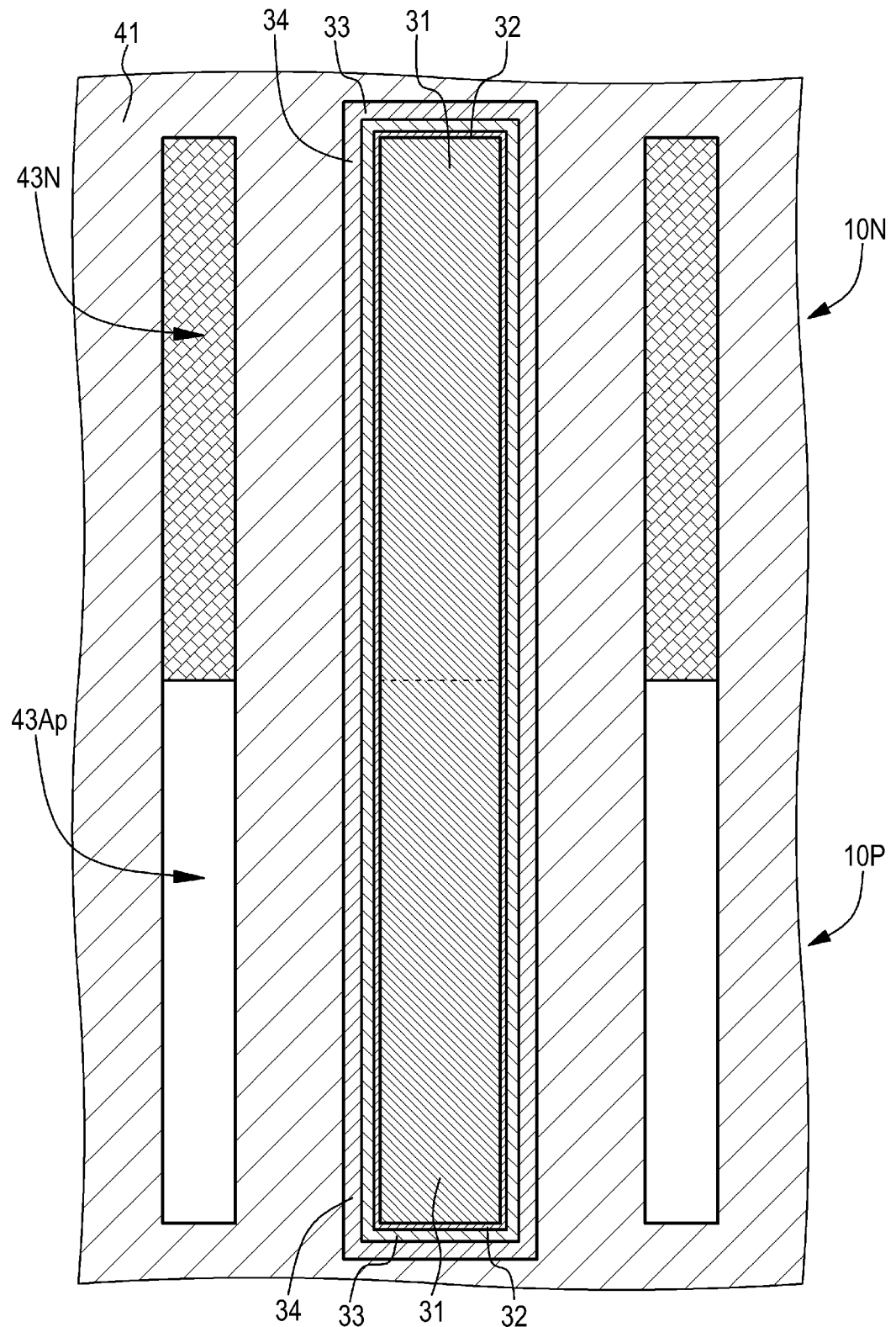
FIG. 16 is a schematic diagram illustrating the layout of each constituting element of the semiconductor device of Example 3, explaining the semiconductor device manufacturing method of Example 3 following FIG. 15.
Figure 17:
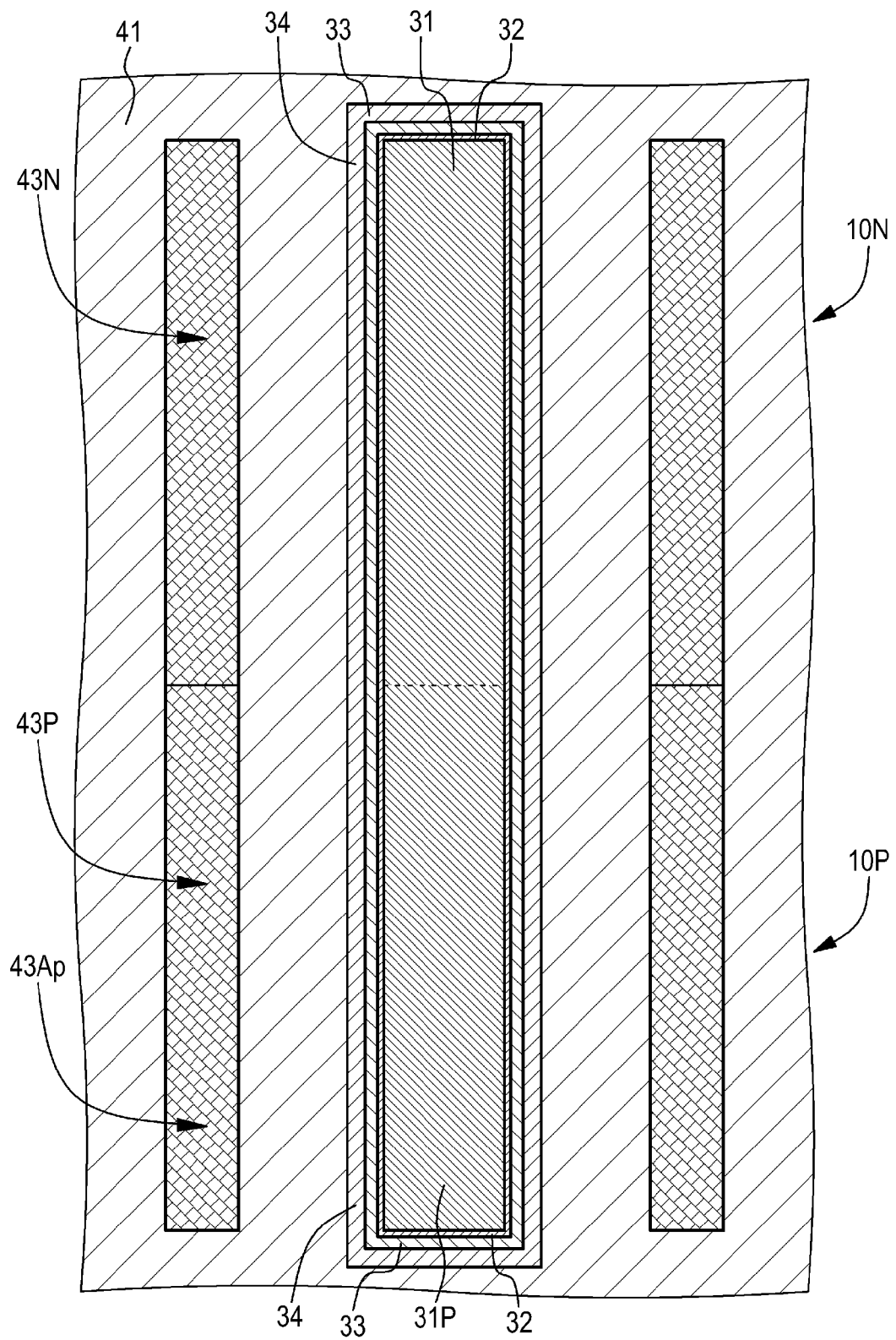
FIG. 17 is a schematic diagram illustrating the layout of each constituting element of the semiconductor device of Example 3, explaining the semiconductor device manufacturing method of Example 3 following FIG. 16.
Figure 18:
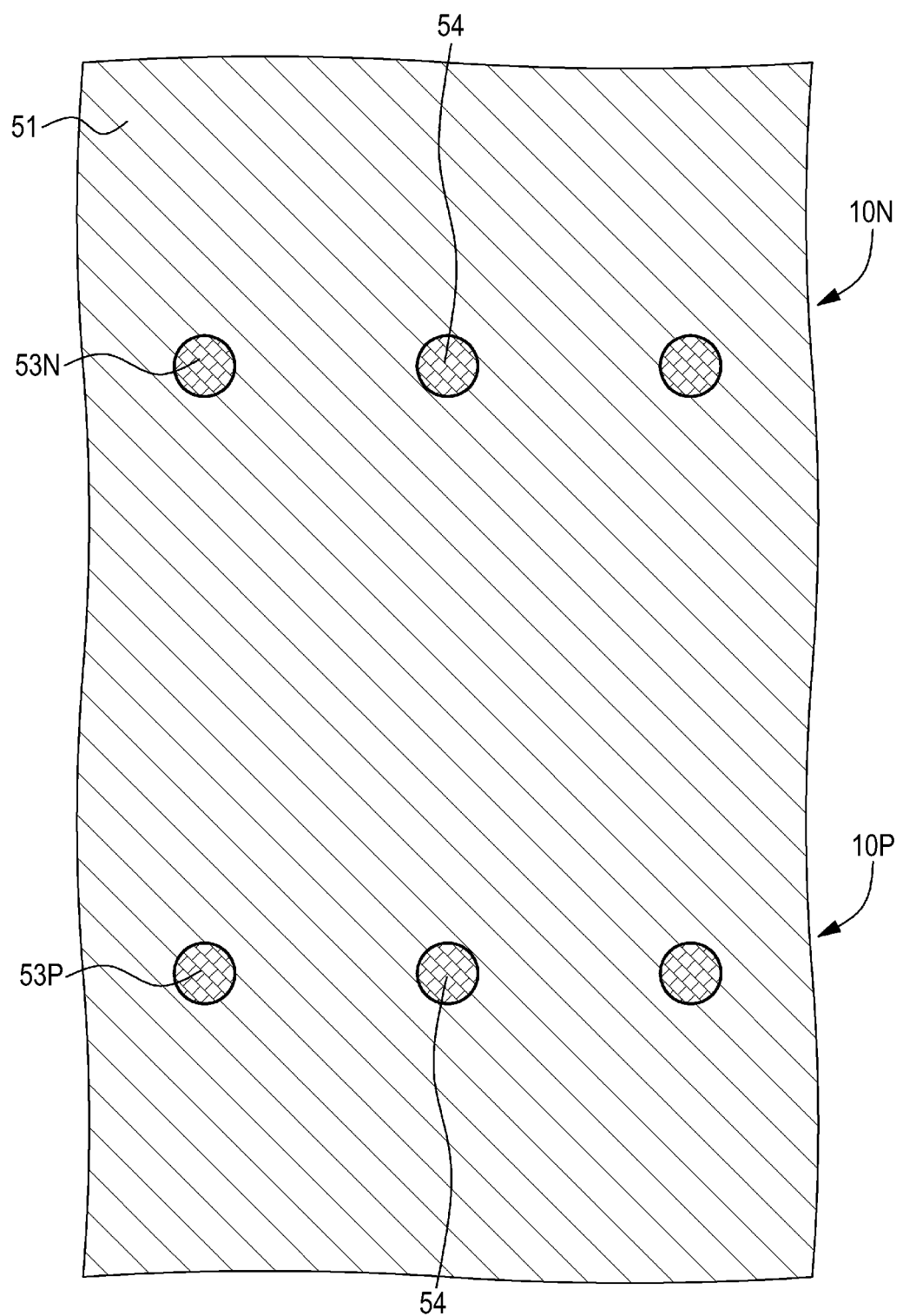
FIG. 18 is a schematic diagram illustrating the layout of each constituting element of the semiconductor device of Example 3, explaining the semiconductor device manufacturing method of Example 3 following FIG. 17.

Thereafter, a resist layer is formed on the first interlayer insulating layer 41, and groove-shaped opening portions are formed in the resist layer using a lithography technique. The first interlayer insulating layer 41 is then etched using the resist layer as an etching mask, and the resist layer is removed. As a result, as illustrated in FIG. 16, groove-shaped opening portions $43A_p$ used to form the first contact portions 43P for the p-channel semiconductor device 10P are formed in the first interlayer insulating layer 41.

Thereafter, a Ti layer, a TiN layer, and a tungsten layer are sequentially formed on the whole surface using a sputtering method, and the tungsten layer, the TiN layer, and the Ti layer on the first interlayer insulating layer 41 are removed by a CMP method. As a result, the first contact portions 43P having a groove shape and connected to the source/drain regions 37P are formed in the groove-shaped opening portions $43A_p$ (see FIG. 17).

Here, the top faces of the gate electrode 31, the first contact portions 43, and the first interlayer insulating layer 41 lie within the same plane. The deposition conditions of the sputtering method for the tungsten layer in the cases of the n-channel semiconductor device 10N and the p-channel semiconductor device 10P are the same as those described in Example 1. The order of forming the first contact portions 43N and the first contact portions 43P is essentially arbitrary.

[Step-320]

Thereafter, as in Step-120 of Example 1, an etching stop layer of SiN having a thickness of about 20 nm to 50 nm is formed on the whole surface, and a second interlayer insulating layer 51 of $SiO_2$ is formed.

[Step-330]

Thereafter, as in Step-130 of Example 1, a resist layer is formed on the second interlayer insulating layer 51, and hole-shaped opening portions are formed in the resist layer using a lithography technique. The second interlayer insulating layer 51 and the etching stop layer are then etched using the resist layer as an etching mask, and the resist layer is removed. As a result, hole-shaped opening portions used to form the second contact portions 53N and 53P are formed in portions of the second interlayer insulating layer 51 above the first contact portions 43N and 43P. Concurrently, hole-shaped opening portions used to form third contact portions 54 may be formed in portions of the second interlayer insulating layer 51 above the gate electrodes 31.

Then, a Ti layer and a TiN layer are sequentially formed on the whole surface using a sputtering method, and after forming a tungsten layer on the whole surface using a CVD method, the tungsten layer, the TiN layer, and the Ti layer on the second interlayer insulating layer 51 are removed by a CMP method. As a result, second contact portions 53N and 53P having the shape of holes and connected to the first contact portions 43N and 43P are formed in the hole-shaped opening portions (see FIG. 18). Concurrently, the third contact portions 54 having the shape of holes and connected to the gate electrodes 31 may be formed in the hole-shaped opening portions.

[Step-340]

Then, wires connected to the second contact portions 53N and 53P and the third contact portions 54 are formed on the second interlayer insulating layer 51 using a known method based on a damascene process.

EXAMPLE 4

Example 4 is a variation of the semiconductor device manufacturing method of Example 3. Example 4 employs the gate electrode forming method of Second Embodiment. Specifically, the gate electrode is formed on a substrate (silicon semiconductor substrate) for each of the n-channel semiconductor device and the p-channel semiconductor device, and after forming the source/drain regions and the channel forming region in the substrate for each of the n-channel semiconductor device and the p-channel semiconductor device, a first interlayer insulating layer whose top face lies on the same plane as the top faces of the gate electrodes is formed on the source/drain regions of the n-channel semiconductor device and the p-channel semiconductor device. Example 4 differs from Example 3 in that the gate insulating film does not extend between the first interlayer insulating layer and the gate electrode.

The semiconductor device manufacturing method of Example 4 is described below.

[Step-400]

First, in a step analogues to Step-200 of Example 2, the gate electrode is formed on a substrate (silicon semiconductor substrate) for each of the n-channel semiconductor device and the p-channel semiconductor device, and after forming the source/drain regions and the channel forming region in the substrate, a first interlayer insulating layer whose top face lies on the same plane as the top faces of the gate electrodes is formed on the source/drain regions.

In other words, Step-200A to Step-200F described in Example 2 are appropriately performed for the n-channel semiconductor device and the p-channel semiconductor device. Specifically, in a step analogous to Step-200A of Example 2, the element isolation region and the active region are formed in the silicon semiconductor substrate for each of the n-channel semiconductor device and the p-channel semiconductor device using a known method, and a gate insulating film, a gate electrode, and a hard mask film are formed on the surface of the silicon semiconductor substrate using a known method. Then, in a step analogous to Step-200B of Example 2, an insulating film is formed on the whole surface for each of the n-channel semiconductor device and the p-channel semiconductor device, and etched back to remain on the side faces of the gate insulating film, the gate electrode, and the hard mask film. As a result, a dummy side-face insulating film is obtained. Thereafter, in a step analogous to Step-200C of Example 2, a first stress applying film is formed for each of the n-channel semiconductor device and the p-channel semiconductor device, and source/drain regions are formed for each of the n-channel semiconductor device and the p-channel semiconductor device in a step analogous to Step-200D of Example 2. Then, in a step analogous to Step-200E of Example 2, a silicide layer is formed over the source/drain regions for each of the n-channel semiconductor device and the p-channel semiconductor device using a known method, and a second stress applying film is formed on the whole surface. Thereafter, in a step analogous to Step-200F of Example 2, a first interlayer insulating layer is formed on the whole surface using a CVD method. Then, the first interlayer insulating layer, the second stress applying film, and the hard mask film are removed by a CMP method until the top faces of the gate electrodes are exposed.

[Step-410]

Then, as in Step-310 of Example 3, groove-shaped first contact portions connected to the source/drain regions are formed in the first interlayer insulating layer. In Example 4, this is performed without removing the gate electrodes and the gate insulating film. Here, the top faces of the gate electrode, the first contact portions, and the first interlayer insulating layer lie within the same plane.

[Step-420]

Thereafter, steps analogous to Step-320 to Step-340 of Example 3 are performed to obtain a semiconductor device of Example 4.

The invention has been specifically described with respect to preferred examples. However, the invention is not limited to these. The structures and configurations of the semiconductor devices described in the foregoing examples are only illustrative, and may be appropriately modified. Further, factors such as the manufacturing steps, manufacturing conditions, and the materials used as described in the foregoing examples are illustrative, and may be appropriately modified.

Figure 19:
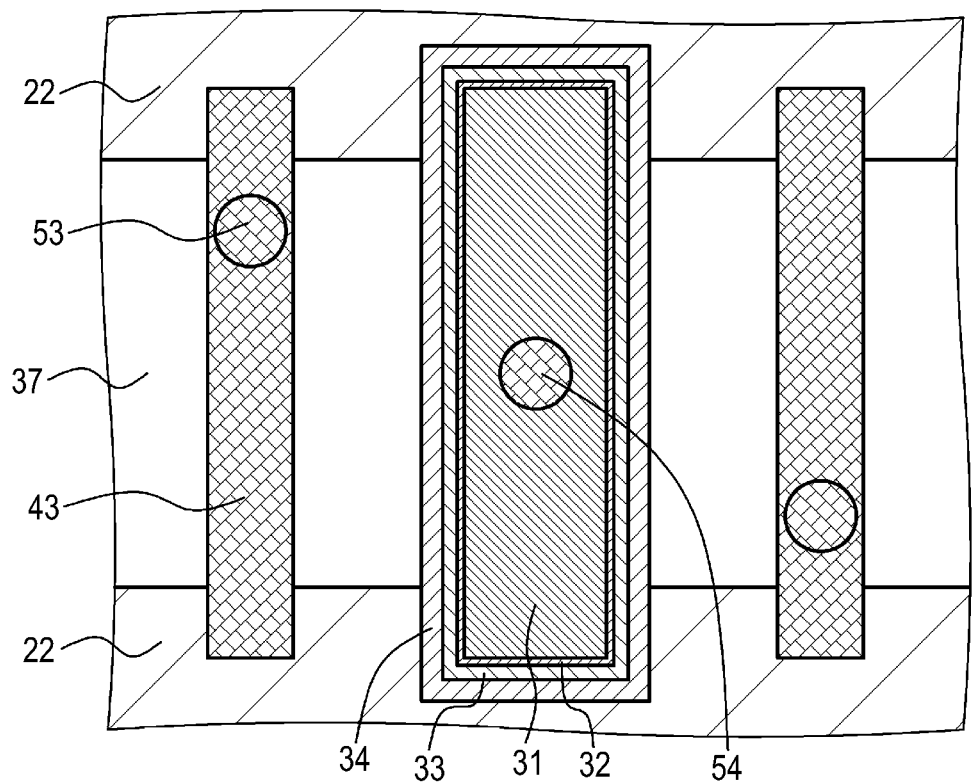
FIG. 19 is a schematic diagram illustrating the layout of each constituting element of a variation of the semiconductor device of Example 1 as viewed from above.
Figure 20:
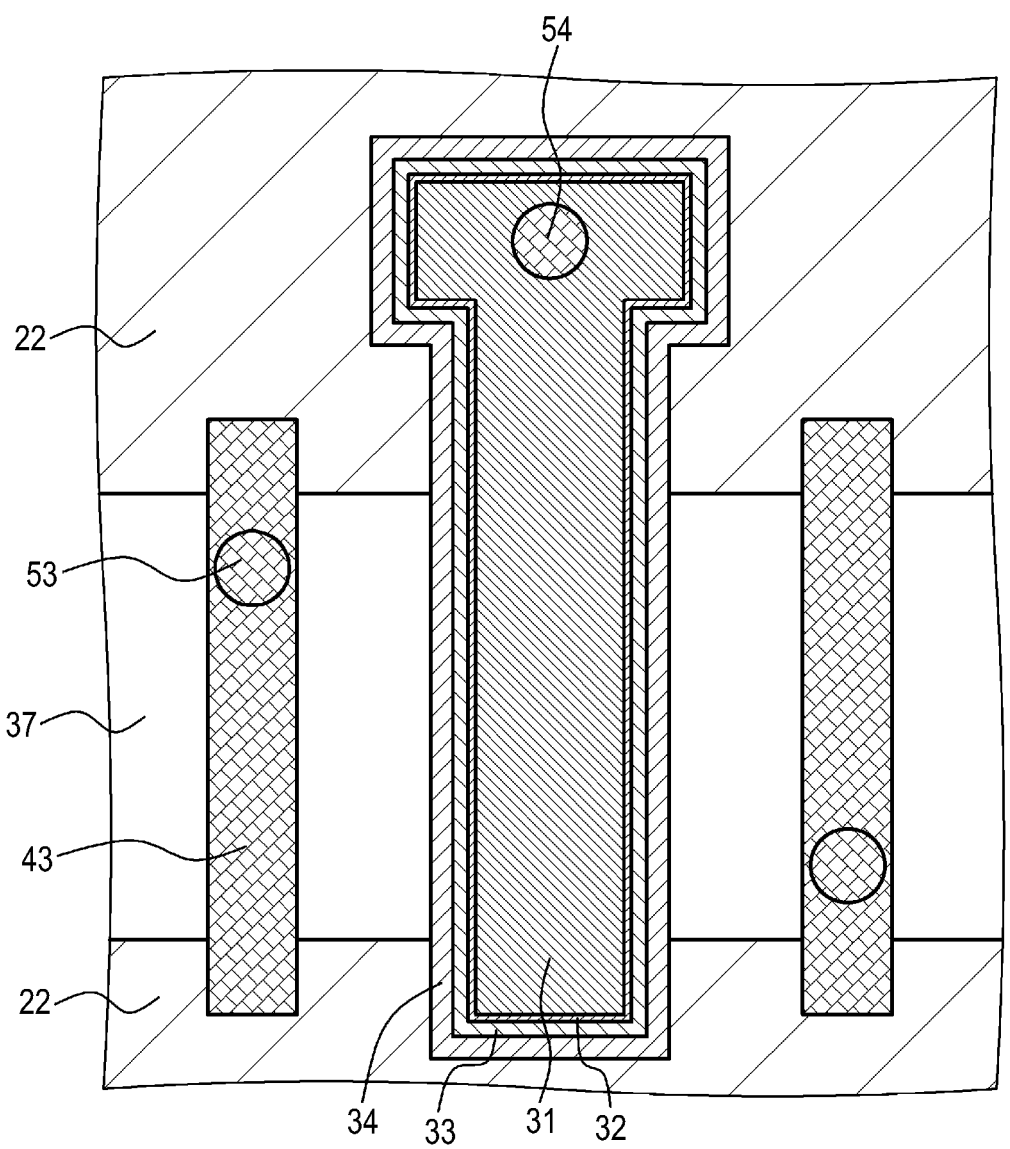
FIG. 20 is a schematic diagram illustrating the layout of each constituting element of another variation of the semiconductor device of Example 1 as viewed from above.

In Example 1, the second contact portions 53 and the third contact portion 54 are disposed horizontally in line. Further, in Example 1, the third contact portion 54 on the gate electrode 31 is above the active region 23. In contrast, in the example illustrated in FIG. 19, the second contact portions 53 and the third contact portion 54 are not horizontally in line. With such a layout, the wires 61 do not overlie each other and can be reduced in length when disposed in a direction perpendicular to the direction of extension of the gate electrode 31. In the example illustrated in FIG. 20, the third contact portion 54 on the gate electrode 31 is above the element isolation region 22. When the width of the gate electrode 31 becomes narrower than the diameter of the third contact portion 54, the contact resistance between the third contact portion 54 and the gate electrode 31 increases. Such an increase in contact resistance can be suppressed with the layout illustrated in FIG. 20.

Figure 21:
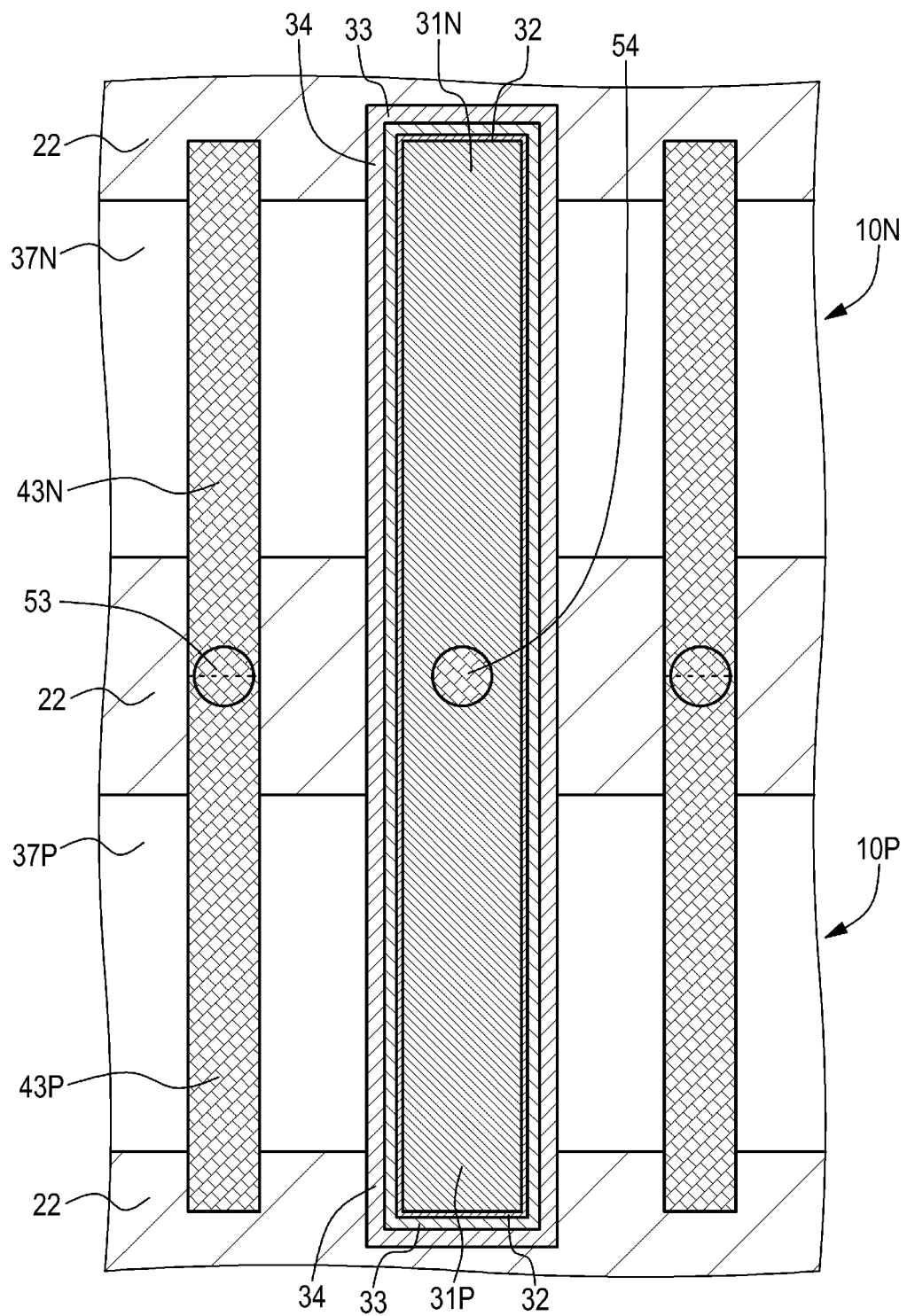
FIG. 21 is a schematic diagram illustrating the layout of each constituting element of a variation of the semiconductor device of Example 3 as viewed from above.
Figure 22:
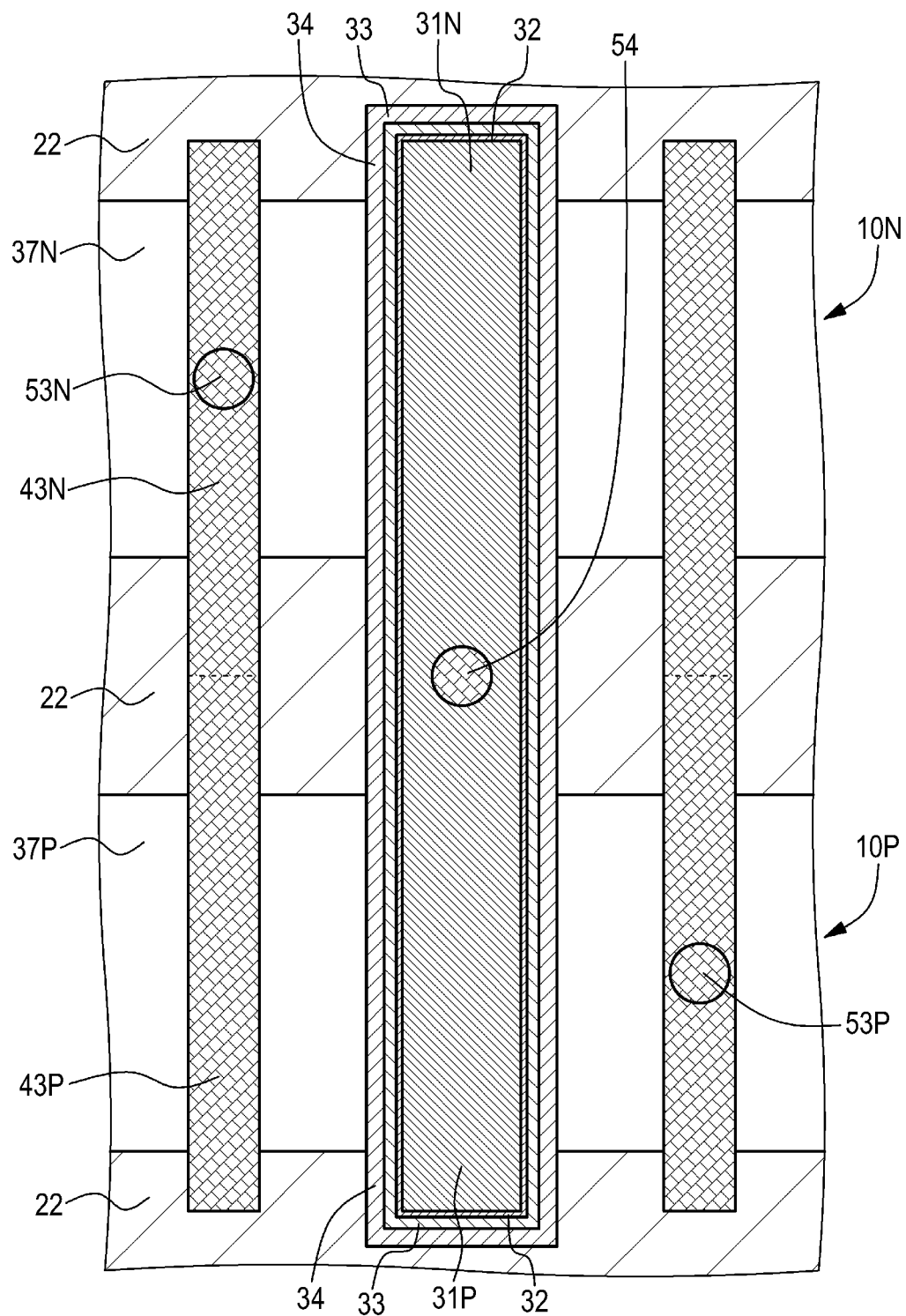
FIG. 22 is a schematic diagram illustrating the layout of each constituting element of another variation of the semiconductor device of Example 3 as viewed from above.
Figure 23:
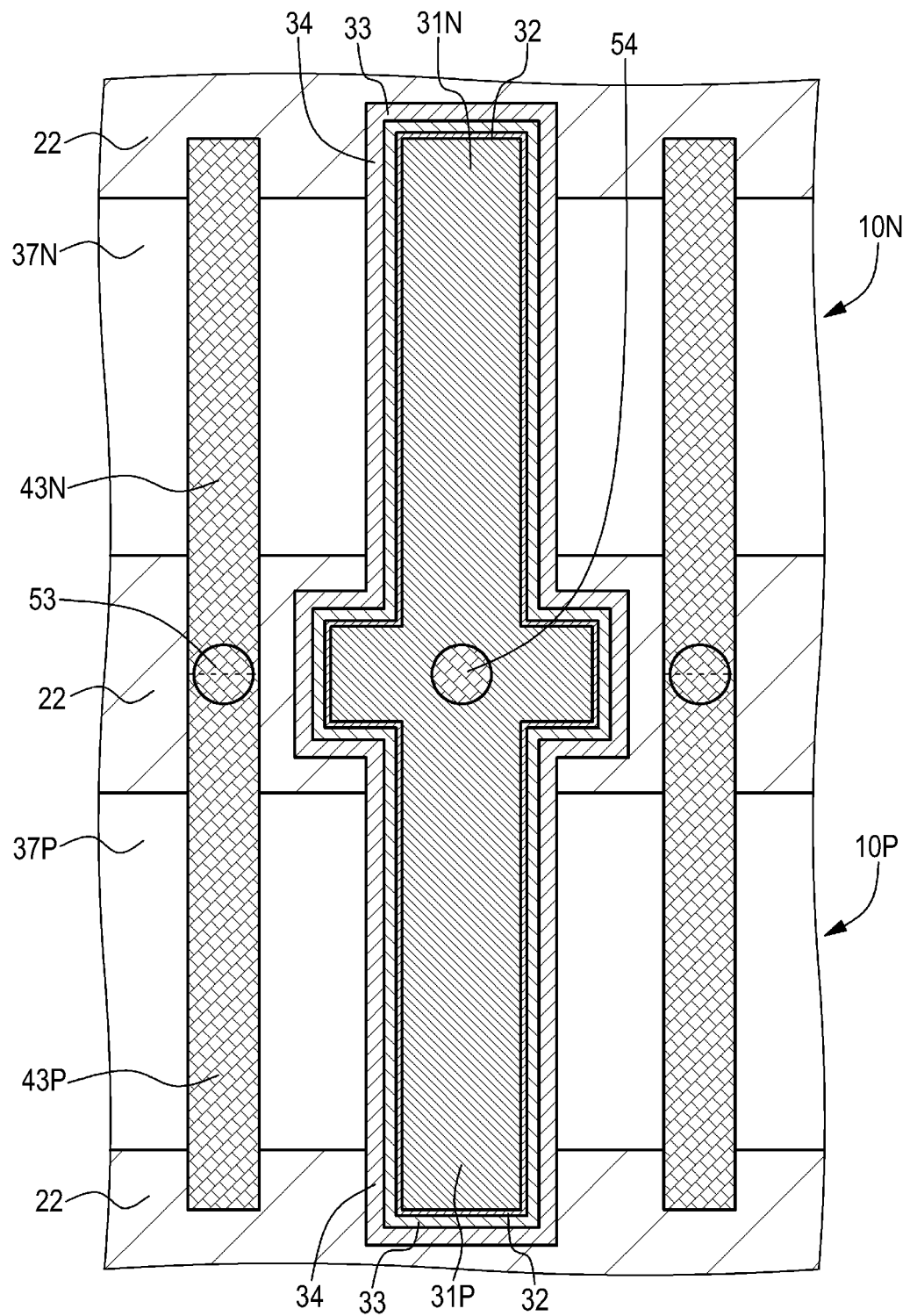
FIG. 23 is a schematic diagram illustrating the layout of each constituting element of yet another variation of the semiconductor device of Example 3 as viewed from above.
Figure 24:
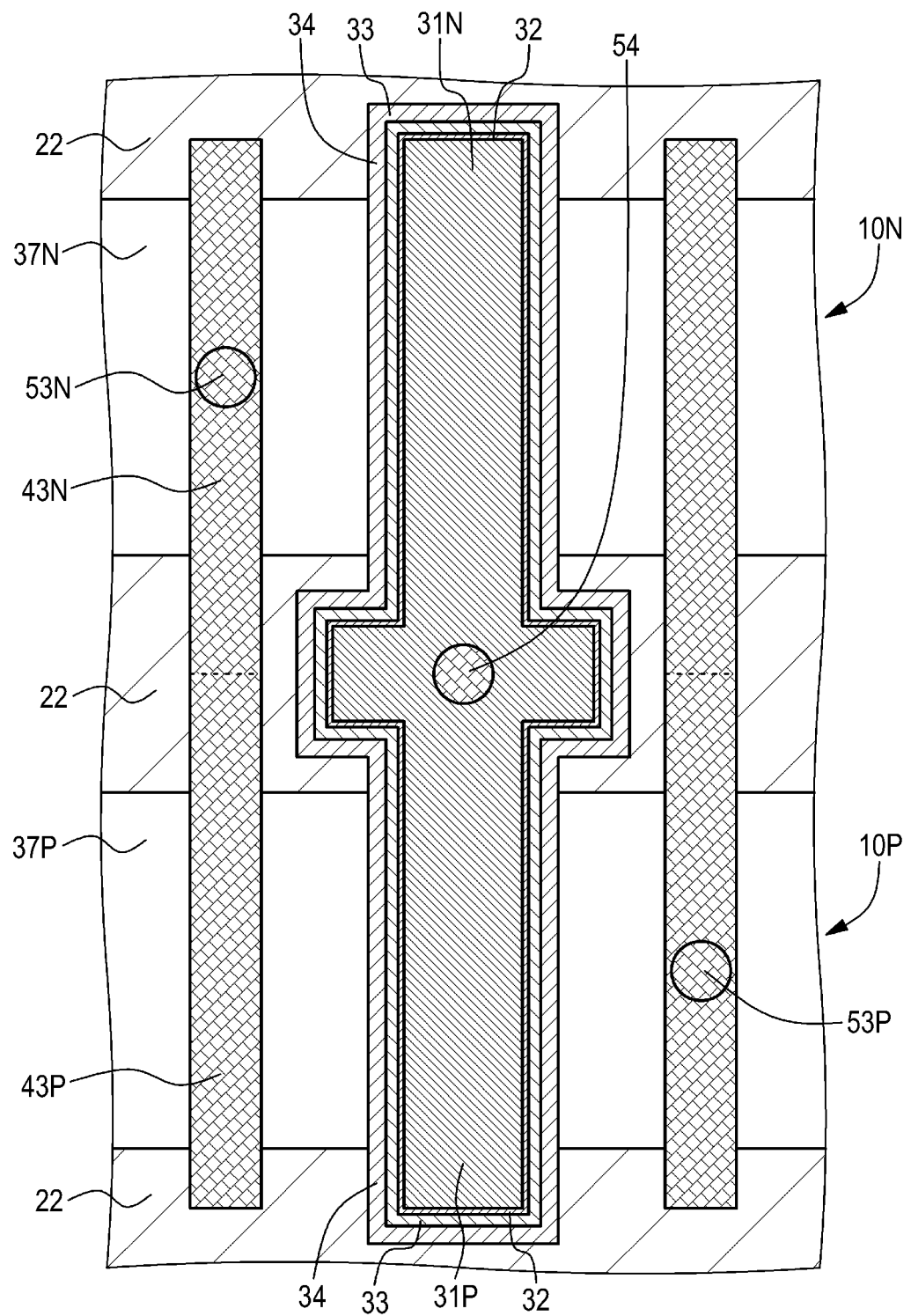
FIG. 24 is a schematic diagram illustrating the layout of each constituting element of still another variation of the semiconductor device of Example 3 as viewed from above.
Figure 25:
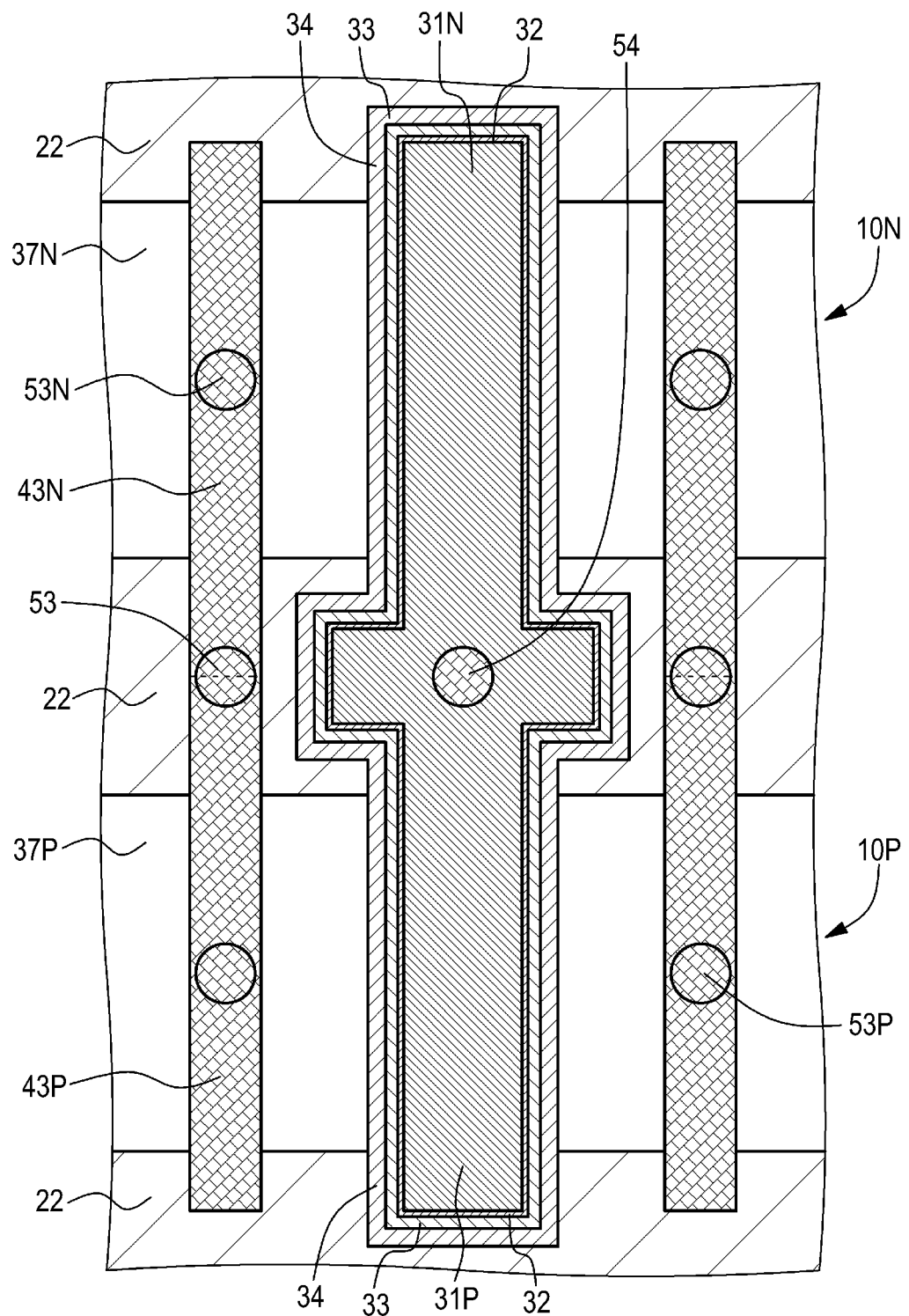
FIG. 25 is a schematic diagram illustrating the layout of each constituting element of yet another variation of the semiconductor device of Example 3 as viewed from above.
Figure 26A:
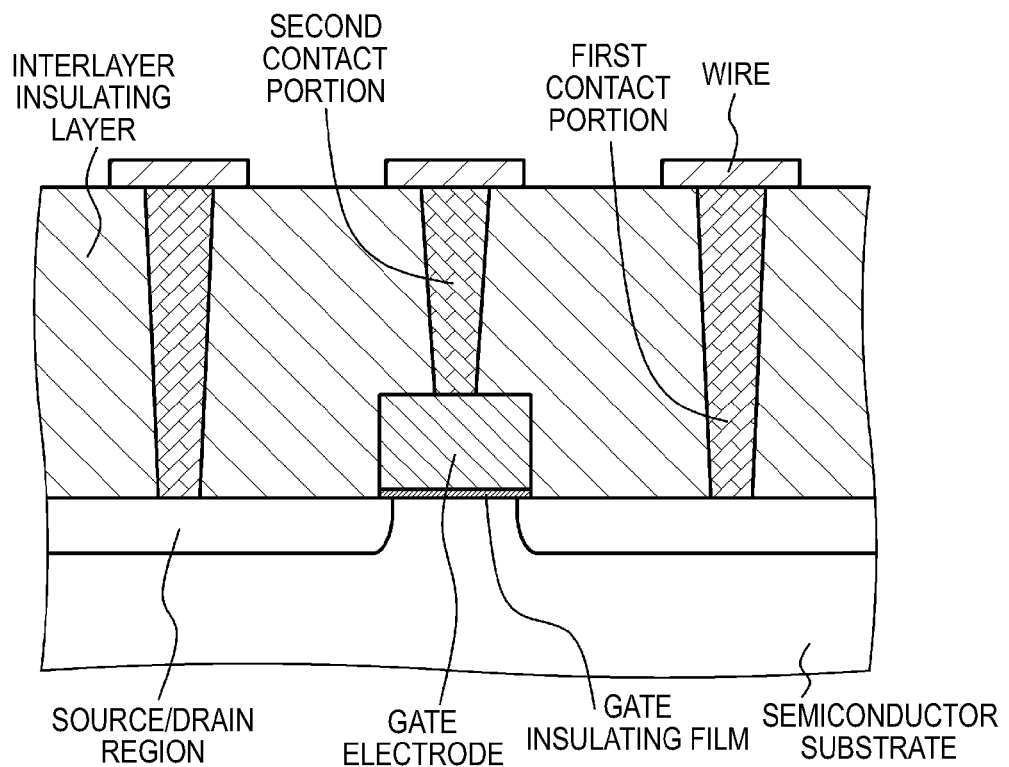
FIG. 26A is a schematic partial cross sectional view of a semiconductor device disclosed in Non-Patent Document 1.
Figure 26B:
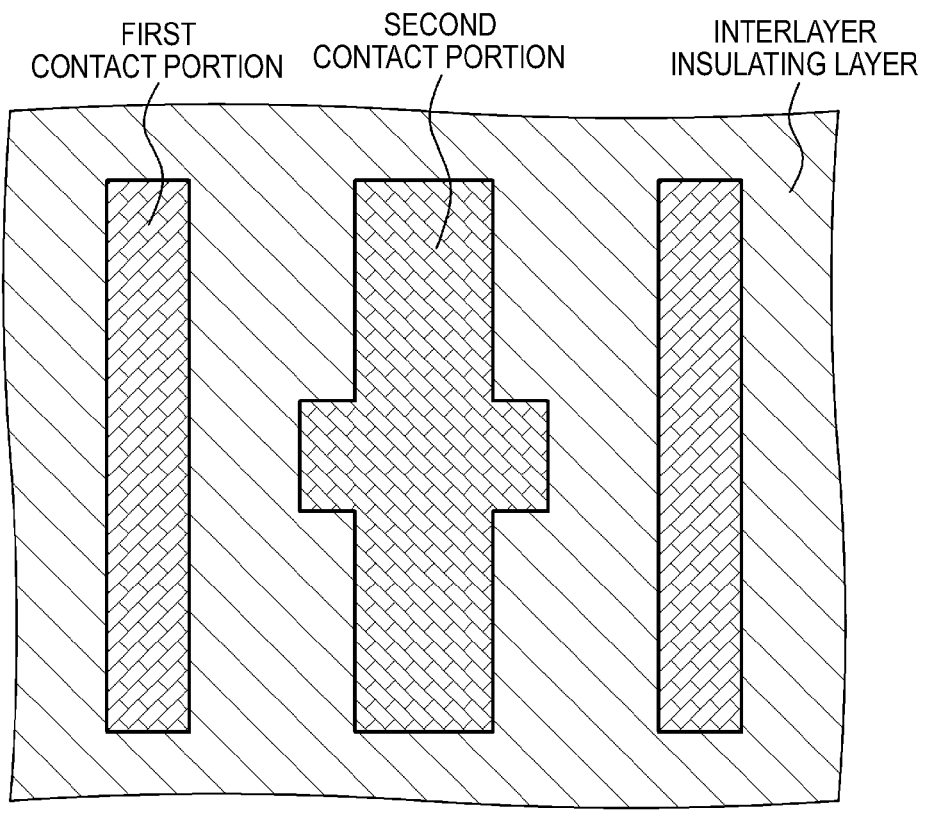
FIG. 26B is a schematic diagram of an interlayer insulating layer as viewed from above.

A variation of the semiconductor device of Example 3 is described below. In the variation illustrated in FIG. 21, a single second contact portion is connected to the first contact portions 43N and 43P. In the variation illustrated in FIG. 22, the second contact portions 53N and 53P, and the third contact portion 54 are not horizontally in line. In the variations illustrated in FIG. 23 and FIG. 24, the gate electrode 31 is wide above the element isolation region 22. In the variation illustrated in FIG. 25, three second contact portions 53, 53N, and 53P are connected to the first contact portions 43N and 43P.

In the foregoing examples, the wires are formed after forming the second contact portions and the third contact portion. However, the wires may be formed simultaneously with the second contact portions and the third contact portion based on the dual damascene process.

In certain instances, the semiconductor device manufacturing methods described in Example 1 and Example 3 may be adapted to form, for example, a gate insulating film of $HfO_2$, and then a dummy gate electrode thereon, instead of forming the dummy gate insulating film in Step-100A and Step-300, and to remove only the dummy gate electrode 71 in Step-100G, and form the gate electrode 31 in the groove 82 for the gate electrode in Step-100H. Further, the semiconductor devices and the semiconductor device manufacturing methods of Example 3 and Example 4 may be adapted so that one of the source/drain regions of the n-channel semiconductor device and one of the source/drain regions of the p-channel semiconductor device are joined to each other by the groove-shaped first contact portion, and that the other source/drain region of the n-channel semiconductor device and the other source/drain region of the p-channel semiconductor device are not joined by the groove-shaped first contact portion provided on these source-drain regions.

The present application contains subject matter related to that disclosed in Japanese Priority Patent Application JP 2009-190645 filed in the Japan Patent Office on Aug. 20, 2009, the entire contents of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor device comprising:
(A) source and drain regions and a channel forming region in a substrate;
(B) a gate electrode above the channel forming region with a gate insulating film between the channel forming region and the gate electrode;
(C) a silicide layer on the substrate over the source and drain regions;
(D) a stress applying layer on the silicide layer;
(E) a first interlayer insulating layer on the source and drain regions;
(F) respective first contact portions in the first interlayer insulating layer and directly connected to the source and drain regions by extending through the stress applying layer and the silicide layer;
(G) a second interlayer insulating layer on the gate electrode, the first interlayer insulating layer, and the first contact portions;
(H) respective second contact portions in portions of the second interlayer insulating layer over the first contact portions so that each second contact portion extends to and contacts a respective first contact portion;
(I) a third contact portion in the second interlayer insulating layer and directly connected to the gate electrode; and
(J) respective wires on the second interlayer insulating layer and connected to the second contact portions and the third contact portion,
wherein,
the gate electrode, the first contact portions, and the first interlayer insulating layer have the same height to their top faces,
each of the first contact portions has a groove shape and has a first dimension that is longer in a first direction than a second dimension in a second direction orthogonal to the first direction,
in cross section, the source and drain regions are linearly separated in the second direction,
each of the second contact portions has a hole shape and has substantially equal first and second dimensions in the first and second directions, respectively, and
the second contact portions and the third contact portion are positioned such that, when viewed in a plan view, the second contact portions and the third contact portion are not aligned along a line that extends in the second direction.

2. The semiconductor device according to claim 1, wherein the semiconductor device is an n-channel semiconductor device, and
wherein the first contact portions have a tensile stress.

3. The semiconductor device according to claim 1, wherein the semiconductor device is a p-channel semiconductor device, and
wherein the first contact portions have a compression stress.

4. The semiconductor device according to claim 1, further comprising a stress applying film in the source and drain regions.

5. The semiconductor device according to claim 1, further comprising an etching stop layer between the gate electrode, the first interlayer insulating layer and the first contact portions, and the second interlayer insulating layer.

6. The semiconductor device according to claim 1, wherein the gate insulating film extends between the first interlayer insulating layer and the gate electrode.

7. The semiconductor device of claim 1, wherein:
each of the first and second contact portions is tapered in cross-section, and
the top surface of each first contact portion is wider in the second direction than a widest width of a bottom surface of the respective second contact portion.

8. The semiconductor device of claim 1, wherein the third contact portion has a hole shape.

9. The semiconductor device of claim 1, further comprising an etch stop layer between the first and second interlayer insulating layers.

10. The semiconductor device of claim 1, wherein:
the semiconductor device further comprises first and second sidewalls flanking the gate electrode, and
the gate insulating film is further between each of the first and second sidewalls and the gate electrode.

11. A semiconductor device that comprises an n-channel semiconductor device and a p-channel semiconductor device each of which includes:
(A) source and drain regions and a channel forming region in a substrate;
(B) a gate electrode above the channel forming region with a gate insulating film between the gate electrode and the channel forming region;
(C) a silicide layer on the substrate over the source and drain regions;
(D) a stress applying layer on the silicide layer;
(E) a first interlayer insulating layer formed on the source and drain regions;
(F) respective first contact portions formed in the first interlayer insulating layer and directly connected to the source and drain regions by extending through the stress applying layer and the silicide layer;
(G) a second interlayer insulating layer formed on the gate electrode, the first interlayer insulating layer, and the first contact portions;
(H) respective second contact portions formed in portions of the second interlayer insulating layer on the first contact portions; and
(I) respective wires formed on the second interlayer insulating layer and connected to the second contact portions,
wherein,
the n-channel and p-channel semiconductor devices are separated by an element isolation region,
the gate electrode, the first contact portions, and the first interlayer insulating layer have the same height to their top faces,
each of the first contact portions of the n-channel semiconductor device and each of the first contact portions of the p-channel semiconductor device has a groove shape, each of the first contact portions of each of the n-channel and p-channel semiconductor devices having a first dimension that is longer in a first direction than a second dimension in a second direction orthogonal to the first direction,
each of the second contact portions of the n-channel semiconductor device and each of the second contact portions of the p-channel semiconductor device has a hole shape, each of the second contact portions of each of the n-channel and p-channel semiconductor devices having substantially equal first and second dimensions in the first and second directions, respectively,
for each of the n-channel and p-channel semiconductor devices, in cross section, the source and drain regions are linearly separated in the second direction,
the first contact portions of the n-channel semiconductor device have a tensile stress,
the first contact portions of the p-channel semiconductor device have a compression stress, and
the first contact portions of the source and drain regions of the n-channel semiconductor device are respectively joined to the first contact portions of the source and drain regions of the p-channel semiconductor device on the element isolation region.

12. The semiconductor device according to claim 11, wherein the gate insulating film extends between the first interlayer insulating layer and the gate electrode in each of the n-channel semiconductor device and the p-channel semiconductor device.

13. The semiconductor device of claim 11, wherein:
each of the first and second contact portions is tapered in cross-section, and
the top surface of each first contact portion is wider in the second direction than a widest width of a bottom surface of the respective second contact portion.

* * * * *